(12) United States Patent
Nakabayashi

(10) Patent No.: US 10,128,421 B2
(45) Date of Patent: *Nov. 13, 2018

(54) LIGHT EMITTING DEVICE

(71) Applicant: NICHIA CORPORATION, Anan-shi, Tokushima (JP)

(72) Inventor: Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 9 days.

This patent is subject to a terminal disclaimer.

(21) Appl. No.: 15/584,150

(22) Filed: May 2, 2017

(65) Prior Publication Data

US 2017/0236981 A1    Aug. 17, 2017

Related U.S. Application Data

(62) Division of application No. 14/333,850, filed on Jul. 17, 2014, now Pat. No. 9,673,364.

(30) Foreign Application Priority Data

Jul. 19, 2013   (JP) ................................. 2013-150445
Jul. 19, 2013   (JP) ................................. 2013-150462
May 20, 2014   (JP) ................................. 2014-104074

(51) Int. Cl.
*H01L 33/36*   (2010.01)
*H01L 33/60*   (2010.01)
(Continued)

(52) U.S. Cl.
CPC .............. *H01L 33/60* (2013.01); *H01L 24/97* (2013.01); *H01L 33/36* (2013.01); *H01L 33/486* (2013.01);
(Continued)

(58) Field of Classification Search
CPC ......................... H01L 24/97; H01L 224/16225
See application file for complete search history.

(56) References Cited

U.S. PATENT DOCUMENTS 9,673,364 B2 *   6/2017   Nakabayashi .......... H01L 33/60
2005/0093146 A1   5/2005   Sakano
(Continued)

FOREIGN PATENT DOCUMENTS

EP   2383807 A2   11/2011
JP   08-264842 A   10/1996
(Continued)

OTHER PUBLICATIONS

Extended European Search Report of the corresponding European Patent Application No. 14177636.9, dated Dec. 3, 2014.

*Primary Examiner* — Fernando L Toledo
*Assistant Examiner* — Valerie N Newton

(57) ABSTRACT

A light emitting device of side-view type includes a substrate, a light emitting element, an insulating member and a light reflecting or sealing member. The substrate includes a pair of connection terminals at least on a first main surface. The light emitting element is disposed on a first main surface side of the substrate and connected to the connection terminals. The insulating member is disposed to cover at least a portion of the connection terminals. The light reflecting or sealing member covers the light emitting element. The connection terminals each includes an element connection portion and an outer connection portion disposed on the first main surface of the substrate. The outer connection portion is configured to connect with an external unit. The insulating member is placed in contact with the light reflecting or sealing member, and disposed between the element connection portion and the outer connection portion.

19 Claims, 19 Drawing Sheets

(51) Int. Cl.
  *H01L 33/50* (2010.01)
  *H01L 33/62* (2010.01)
  *H01L 23/00* (2006.01)
  *H01L 33/48* (2010.01)
  *H01L 25/075* (2006.01)

(52) U.S. Cl.
  CPC .............. *H01L 33/50* (2013.01); *H01L 33/62* (2013.01); *H01L 25/0753* (2013.01); *H01L 2224/16225* (2013.01); *H01L 2224/73253* (2013.01); *H01L 2924/01322* (2013.01); *H01L 2924/12035* (2013.01); *H01L 2924/12042* (2013.01); *H01L 2924/181* (2013.01); *H01L 2933/0033* (2013.01); *H01L 2933/0058* (2013.01); *H01L 2933/0066* (2013.01)

(56) References Cited

U.S. PATENT DOCUMENTS

| | | |
|---|---|---|
| 2005/0277216 A1 | 12/2005 | Asakawa |
| 2007/0001187 A1 | 1/2007 | Kim |
| 2008/0128894 A1 | 6/2008 | Sakano |
| 2009/0212315 A1 | 8/2009 | Sakamoto |
| 2010/0120182 A1 | 5/2010 | Kim |
| 2011/0121449 A1 | 5/2011 | Lin et al. |
| 2012/0061706 A1 | 3/2012 | Kamada |
| 2012/0248484 A1 | 10/2012 | Sato et al. |
| 2012/0261699 A1 | 10/2012 | Ooyabu et al. |
| 2012/0302124 A1 | 11/2012 | Imazu |
| 2012/0319563 A1 | 12/2012 | Ishihara et al. |
| 2013/0099264 A1 | 4/2013 | Zimmerman et al. |
| 2013/0127328 A2 | 5/2013 | Ishihara et al. |
| 2014/0319570 A1 | 10/2014 | Ishihara et al. |

FOREIGN PATENT DOCUMENTS

| | | |
|---|---|---|
| JP | 08-330637 A | 12/1996 |
| JP | 2001-223391 A | 8/2001 |
| JP | 2006-156462 A | 6/2006 |
| JP | 2007-019505 A | 1/2007 |
| JP | 2008-258080 A | 10/2008 |
| JP | 2009-141030 A | 6/2009 |
| JP | 2009-206261 A | 9/2009 |
| JP | 2010-157638 A | 7/2010 |
| JP | 2010-212352 A | 9/2010 |
| JP | 2010-258478 A | 11/2010 |
| JP | 2011-134829 A | 7/2011 |
| JP | 2012-156443 A | 8/2012 |
| JP | 2012-216713 A | 11/2012 |
| JP | 2012-243822 A | 12/2012 |
| JP | 2013-004802 A | 1/2013 |

* cited by examiner

LIGHT EMITTING DEVICE

CROSS-REFERENCE TO RELATED APPLICATIONS

This application is a continuation application of U.S. patent application Ser. No. 14/333,850, filed on Jul. 17, 2014. This application claims priority to Japanese Patent Applications No. 2013-150445 filed on Jul. 19, 2013, No. 2013-150462, filed on Jul. 19, 2013 and No. 2014-104074 filed on May 20, 2014. The entire disclosures of U.S. patent application Ser. No. 14/333,850, Japanese Patent Application Nos. 2013-150445, 2013-150462, and 2014-104074 are hereby incorporated herein by reference.

BACKGROUND

Technical Field

The present disclosure relates to a light emitting device and to a method of manufacturing the same.

Related Art

In the prior art, a light emitting device has been proposed that is configured as a chip scale package (CSP) having similar size as a light emitting chip (for, example, JP2001-223391A). This type of light emitting device is suitable for a top-view mounting method, and as the light emitting device itself is thin, the light emitting device can be used extremely efficiently depending on its use. Furthermore, the light emitting device enables enhanced production efficiency and realizes further reduction in thickness by formation of a projecting portion on a lead electrode that is provided in the package.

On the other hand, a side-view type light emitting device is used as a backlight light source for a display panel of an electronic device or the like.

For example, a side-view type light emitting device is proposed which includes a chip-shaped base material having a recessed portion, a light emitting element, and a substrate which is formed on the surface of the base material and have a pair of terminals connected with the light emitting element (for example, JP H08-264842A). The light emitting device is configured so that the pair of terminals that extend from below the light emitting element, are disposed in the periphery of the surface in proximity to both end surfaces of the base material.

SUMMARY

The present disclosure relates to a light emitting device. A light emitting device of side-view type includes a substrate, a light emitting element, an insulating member and a light reflecting or sealing member. The substrate includes a pair of connection terminals at least on a first main surface of the substrate. The light emitting element is disposed on a first main surface side of the substrate and connected to the connection terminals. The insulating member is disposed to cover at least a portion of the connection terminals. The light reflecting or sealing member covers the light emitting element. The connection terminals each includes an element connection portion and an outer connection portion disposed on the first main surface of the substrate. The element connection portion is connected with the light emitting element and the outer connection portion being configured to connect with an external unit of the light emitting device. The insulating member is placed in contact with the light reflecting or sealing member, and disposed between the element connection portion and the outer connection portion

DETAILED DESCRIPTION

Figure 1:
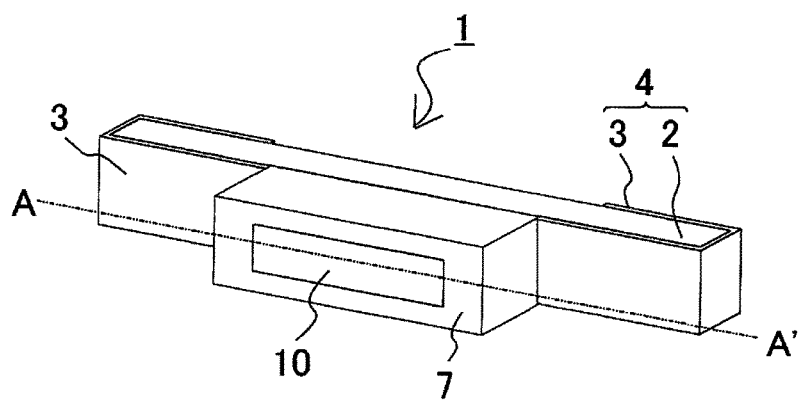
FIG. 1 is a schematic perspective view illustrating a light emitting device according to an embodiment of the present invention.

As the mounting method of the side-view type light emitting device differs from that of the top-view type disclosed above, it is difficult for the side-view type light emitting device to achieve the stability of the mounting, the light flux distribution, or the like at a similar amount to the top-view type light emitting element.

In particular, due to the need for further downsizing and reductions in thickness in light emitting devices in recent years, the substrate is becoming flatter and is scaling down to minimize the occupied space of the chip scale package itself. Consequently, there has been a transition in a metal member used as a terminal from a tabular lead electrode to a metallic film formed directly on the substrate itself as a thin electrode film. Even in the case where this type of metallic film is used in the package, and in particular in relation to a side-view type light emitting device, there is a need for a light emitting element that enables stable and highly accurate arrangement and mounting without element failure during the arrangement of the light emitting element onto the package and the mounting onto the mounting board of the light emitting device. Furthermore, a light emitting device, that emits light from a side surface and is mounted on a mounting board to orient the light extraction surface in a lateral direction, is mounted on a solder or the like disposed on the same surface as the terminal on which the light emitting element is mounted.

Even when for example the light emitting element is sealed with a sealing member, a portion of the solder or the like that is disposed on the same surface, or the flux contained in the solder of the like along the end surface penetrates between the sealing member and the terminal, and thus the reliability of the light emitting device may be degraded.

In particular, in a light emitting device that meets a need for a reduction in width, since the terminal on which the light emitting element is mounted and the terminal that is fixed with the solder or the like are disposed closely, the allowable margin for penetration of solder or the like is extremely small, and the defects described above may occur.

Consequently, there is a need to realize further enhanced light extraction efficiency of the light emitting element as there is the need for further high output, high illumination, and the like by smaller light emitting chips.

The present disclosure is proposed in relation to the problems above, and has the object of providing a small and thin light emitting device that enables a stable and highly accurate arrangement and mounting without element failure during the arrangement of the light emitting element onto the package and the mounting onto the mounting board of the light emitting device.

According to the present disclosure, even the light emitting device is a small and thin, a stable and highly accurate arrangement and mounting can be carried out without element failure during the arrangement of the light emitting element onto the package, and the mounting onto the mounting board of the light emitting device.

Embodiments for implementing the light emitting device and the method of manufacturing the light emitting device of the present invention will be described below with reference to the accompanying drawings. In the following embodiment of the light emitting device and the method of manufacturing the light emitting device that embody the technological concept of the present invention are just examples, and unless otherwise specified, the constituent parts discussed in the embodiments are not intended to limit the scope of the present invention. Further, constitutions described in examples and the embodiments can be employed in other examples and embodiments. The sizes and the arrangement relationships of the members in each of drawings are occasionally shown exaggerated for ease of explanation.

In one embodiment, the light emitting device includes a substrate provided with a pair of connection terminals, a light emitting element, and a light reflecting member. This light emitting device may be used in any appropriate mounting manner, however it is preferred that the light emitting device is mounted in a mounting configuration termed a side-view type, a so-called side surface light emitting type. That is to say, the mounting surface is configured as a surface that is adjacent to the light extraction surface.

Also, in another embodiment, the light emitting device includes a substrate provided with a pair of connection terminals, a light emitting element, a sealing member and an insulating member.

In this specification, the light extraction surface of the light emitting device may be termed the upper surface, the surface that is closely adjacent to or intersects with the light extraction surface may be termed the side surface, and one of the side surfaces may be termed the mounting surface for the light emitting device. In this manner, the surface that corresponds to the light extraction surface of the light emitting device of the surfaces of the respective members and the respective elements that configure the light emitting device may be termed a first main surface (that is to say, the upper surface), and the surface that is opposite to the first main surface may be termed a second main surface (that is to say, the lower surface). The surface that is closely adjacent to or intersects with to the first main surface and the second main surface (that is to say, the surface that corresponds to the side surface of the light emitting device) may be termed the end surface.

<Substrate>

The substrate includes a pair of connection terminals corresponding to negative and positive electrode at least on the first main surface thereof. These connection terminals normally are formed at least on the first main surface of the base material. The first main surface is denoted as the surface of one of the substrate or the base material.

There is no limitation in relation to the shape of the substrate, however, the shape of the substrate may correspond to the shape of the base material as described below. For example, at least the first main surface is preferably elongated in a longitudinal direction, and more preferably includes a short dimension that is orthogonal to the longitudinal direction.

(Base Material)

The base material may be formed by any appropriate material, and for example, includes a metal, ceramic, resin, dielectrics, pulp, glass, paper or a composite material of those materials, or a composite material of those materials and a conductive material (for example, a metal, carbon, or the like). The metal includes copper, iron, nickel, chromium, aluminum, silver, gold, titanium or an alloy thereof. The resin includes epoxy resins, bismaleimide triazine (BT) resins, polyimide resins and the like. The resin may include a white pigment such as titanium oxide. Of those materials, a ceramic or composite resin is preferred.

In the case where the base material is formed by such materials, cost effective procurement is possible by application of known manufacturing techniques.

Examples of the ceramic includes aluminum oxide, aluminum nitride, zirconium oxide, zirconium nitride, titanium oxide, titanium nitride or a mixture thereof. Use of aluminum nitride having high thermal radiation property is preferred. The composite resin is preferably a glass epoxy resin. The base material may be rigid to configure to ensure a suitable strength, and may be flexible.

There is no particular limitation in relation to the shape, dimensions, thickness or the like of the base material in one light emitting device, and such features may be suitably set. The shape of the first main surface (flat surface) for example can be a circular, or a polygonal shape such as a quadrilateral, or the like, a rectangle is preferred. It is preferred that the dimensions are such that the planar area that is larger than the light emitting element as described below. In particular, it is preferred that the dimensions have a length of 2 to 5 times that of one side of the light emitting element. The thickness is about 50 to 300 microns.

(Connection Terminal)

The pair of connection terminals formed at least on the first main surface of the substrate. A portion of the edge portion of the connection terminal is preferably formed to coincide with a portion of the edge portion of the first main surface of the substrate. In other words, it is preferred that a portion of the end surface of the connection terminal and a portion of the end surface of the substrate are formed on the same plane. In this manner, the mounting characteristics of the light emitting device in a side-view type mounting can be enhanced. In this context, the same plane means that there is no unevenness or almost none, but means that an unevenness of the level of several microns to several tens of microns is allowable. The means of "coincide with" and "same plane" apply hereafter in the specification.

The connection terminal includes an element connection portion configured to connect with the electrode of the light emitting element (reference is made to $3c$ on FIG. 15) and an outer connection portion configured to connect with an external unit of the light emitting device (reference is made to $3b$ in FIG. 2 and FIG. 15), on the first main surface. The outer connection portion preferably extends onto the second main surface in addition to the first main surface of the substrate. For example, it is preferred that the connection terminal is provided to extend from the first main surface onto the surface that is present between the first main surface and the second main surface (that is to say, the end surface), or is provided to extend from the first main surface onto the end surface that is present between the first main surface and the second main surface, and then onto the second main surface (for example, a U shape when viewed in cross section) (reference is made to the connection terminal 3 in FIG. 2, and the connection terminal 43 in FIG. 8C). The end surface in this context means the whole or a portion of one end surface that is present between the first main surface and the second main surface. However in addition to a portion or the whole of a specific end surface that is present between the first main surface and the second main surface, a portion of the one or two end surfaces that are closely adjacent to the specific end surface may also be included.

Figure 3:
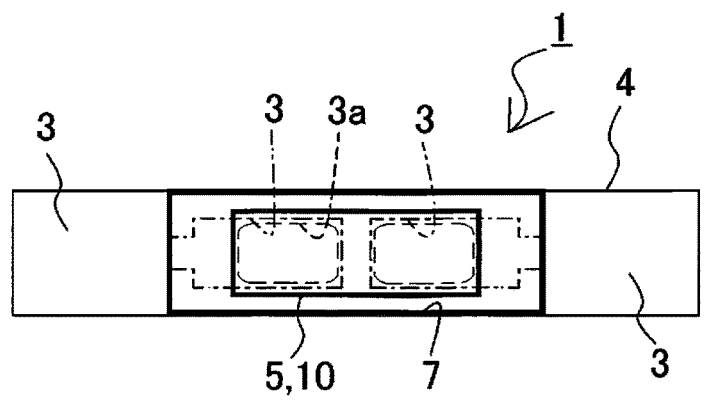
FIG. 3 is a perspective plan view of the light emitting device of FIG. 1.
Figure 15:
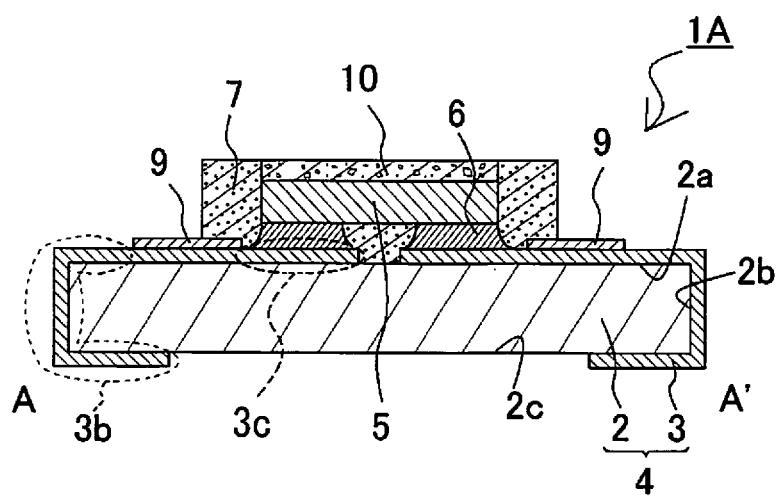
FIG. 15 is a cross-sectional view taken along line A-A' of the light emitting device of FIG. 14.

Normally, the element connection portion is disposed on the first main surface, and the outer connection portion is disposed on (i) the first main surface, (ii) the first main surface and the end surface, or (iii) the first main surface, the end surface and the second main surface (reference is made to FIG. 3 and FIG. 15).

The region of connection of the connection terminal with the light emitting element on the first main surface of the substrate includes a protruding portion configured to project from the surface of the connection terminal. This region may be referred to below as the "element connection portion".

There is no particular limitation in relation to the shape, height, dimensions and the like of the protruding portion, and they can be suitably adjusted considering the size of the substrate, the thickness of the connection terminal, and the size of the light emitting element.

For example, two protruding portions are preferably arranged with a shape, size and position to respectively correspond to the pair of respective electrodes that is formed on the light emitting element as described below.

The planar shape of the protruding portion includes a circle, oval or a ring, a polygonal shape such as a triangle or quadrilateral, a shape in which the angles of those shapes are rounded, a polygonal shape such as the letters X, L, E, V, or the like, or a shape in which the angles of those letters are rounded. Of those shapes, it is preferred that at least a portion of the external shape in a plan view of the protruding portion is a shape that corresponds to the outer shape of the electrode of the light emitting element. In this manner, as described below, the mounting performance can be enhanced due to the effect of self-alignment. Furthermore, it is preferred that a side of a polygon is configured with a shape which is indented in an inner side thereof such as the shape of an X (the central portions of sides are indented). Accommodation of molten material in the indented portion can be thereby facilitated, and therefore the mounting of the light emitting element can be stabilized.

It is preferred that the inclination on the side surface of the protruding portion is nearly vertical. In this manner, when the light emitting element is disposed on the protruding portion and connected by molten material, movement of the light emitting element that is disposed thereon is impeded, and the mounting of the light emitting element can thereby be stabilized.

The regions of connection with the light emitting element with the pair of connection terminals are normally separated at least on the first main surface of the substrate. The protruding portion may be disposed closely adjacent to the edge portion of the connection terminal, or separated from the edge portion, and may be partially in proximity and partially separated. Of those configurations, it is preferred that entire edge portion of the protruding portion is separated from the edge portion of the connection terminal and disposed on an inner side of the connection terminal. (For example, reference is made to the protruding portion 3a in FIG. 3, the protruding portion 13a in FIG. 5A, and the protruding portion 43a in FIG. 8E and FIG. 9E). In case where the protruding portion is disposed in this manner, even if molten material in a molten state as described below flows from the protruding portion during mounting process of the light emitting element, the material can be accommodated in the periphery of the protruding portion, shorting of the pair of connection terminals by the molten material and penetration of the molten material into an unintended area can be prevent, and accurate fixation of the light emitting element to the desired position is enabled. Furthermore, it is possible to inhibit solder for mounting of the light emitting device or flux contained therein from penetrating along the connection end surface under the light reflecting member described below to under the light emitting element.

The height of the protruding portion should protrude from the region at which the film exhibits minimum thickness on the connection terminal on the first main surface of the substrate, and is preferably at least 10%, at least 20%, at least 30%, at least 40%, at least 50%, or at least 100% of the thickness of the region at which the thin film exhibits minimum thickness. In other words, the thickness of the protruding portion is about 1 to 40 microns when the thickness of the thin film portion of the connection terminal on the first main surface exhibits a minimum thickness of normally 10 to 40 microns.

The connection terminal for example can be formed by a single layer or multiple layers of a metal such as Au, Pt, Pd, Rh, Ni, W, Mo, Cr, Ti, Fe, Cu, Al, Ag, or an alloy thereof. Of those configurations, a configuration that exhibits good conductive and mounting properties is preferred. A material is preferred that exhibits good wettability and connection performance with the molten material (for example, the solder) that is used during mounting of the light emitting device. In particular, copper or a copper alloy is preferred in view of thermal radiation properties. A covering film may be formed on the surface of the connection terminal with high light reflective properties by use of silver, platinum, tin, gold, copper, rhodium, or an alloy thereof. The multiple layers of the connection terminal include W/Ni/Au, W/Ni/Pd/Au, W/NiCo/Pd/Au, and the like.

Figure 8A:
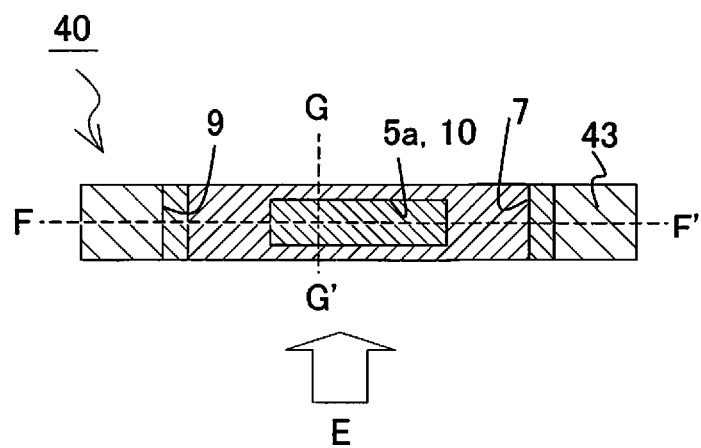
FIG. 8A is a schematic plan view illustrating a light emitting device according to still another embodiment of the present invention.
Figure 8B:
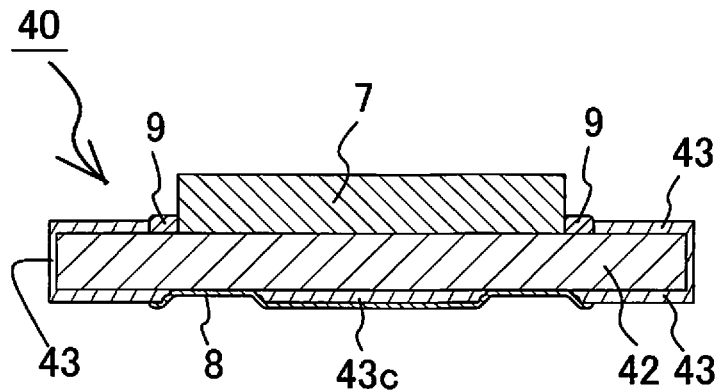
FIG. 8B is a side view viewed from a side of arrow E of FIG. 8A.
Figure 8C:
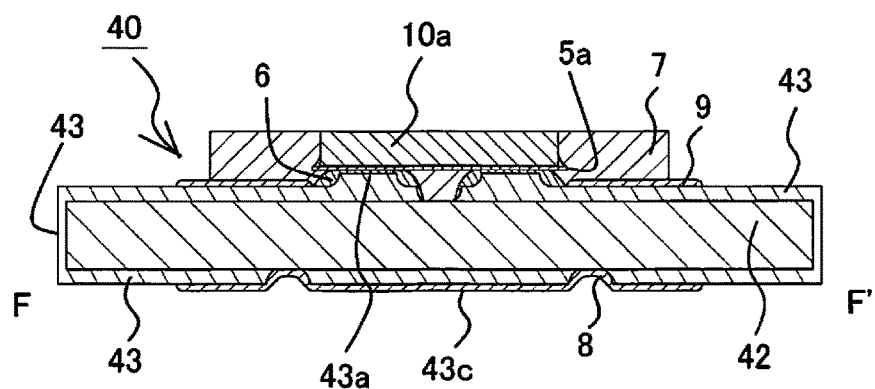
FIG. 8C is a cross-sectional view taken along line F-F' of FIG. 8A.
Figure 9A:
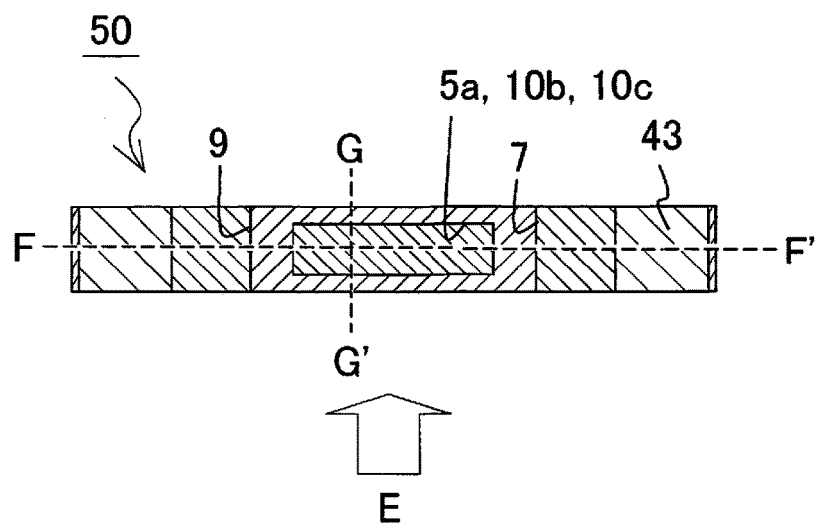
FIG. 9A is a schematic plan view illustrating a light emitting device according to still another embodiment of the present invention.
Figure 9B:
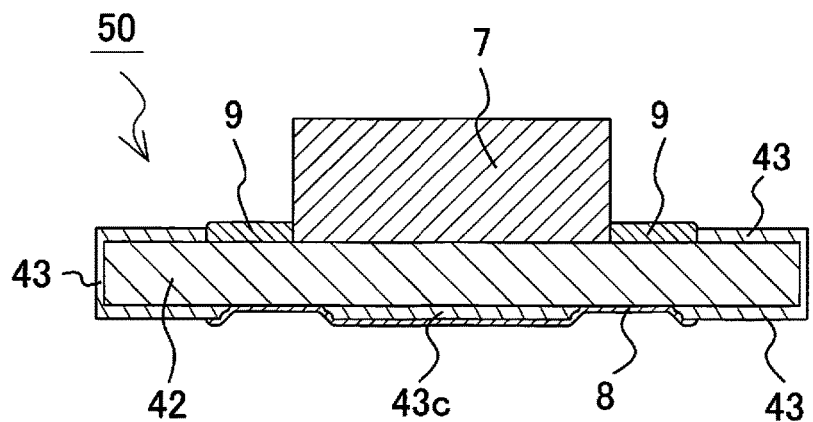
FIG. 9B is a side view viewed from a side of arrow E of FIG. 9A.
Figure 9C:
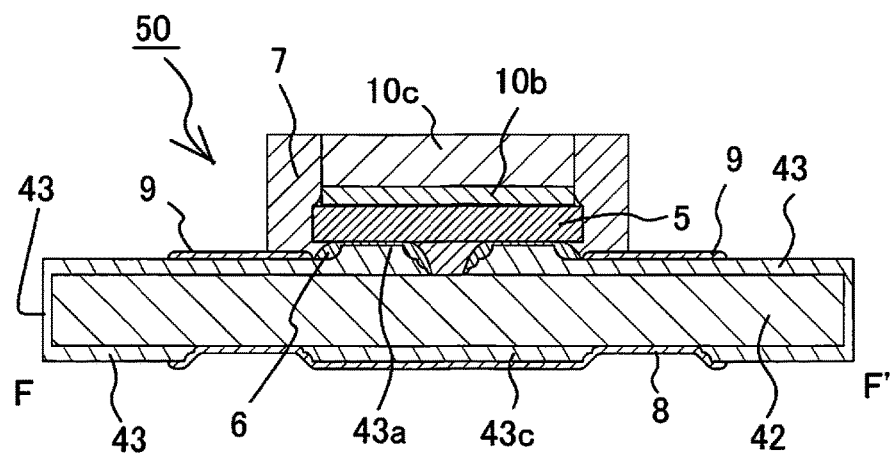
FIG. 9C is a cross-sectional view taken along line F-F' of FIG. 9A.
Figure 9D:
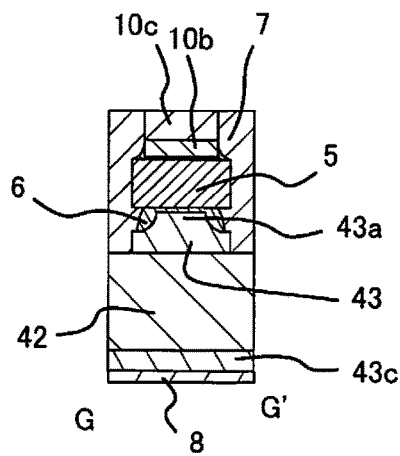
FIG. 9D is a cross-sectional view taken along line G-G' of FIG. 9A.

The connection terminal may include partial differences in relation to thickness or the number of layers (reference is made to the connection terminal 43 in FIG. 8B and FIG. 9B, and the protruding portion 43a of FIG. 8C and FIG. 9C).

The connection terminal may use wiring, a lead frame or the like, and may be formed by using vapor deposition, a sputtering method, plating or the like onto the surface of the base material. Of those methods, the use of plating is preferred. In particular, after formation of a single film or multilayer film of a metal or alloy as described above at least on the first main surface, the protruding portion can be formed by forming a further layer being a single layer or multiple layers of metal or alloy, by use of a mask, on the single layer or multiple layers. Also, after formation of a thick film by use of plating or the like onto the surface of the substrate, the protruding portion may be formed by removing a portion other than the protruding portion by use of etching. This method may achieve a nearly vertical configuration in relation to the gradient of the side surface of the protruding portion. Even in case where using an aggregate substrate describer later, since a deviation in the plating thickness (height of the protruding portion) can be reduced, production characteristics can be enhanced.

The thickness of the connection terminal can be of several microns to several hundreds of microns.

Figure 8D:
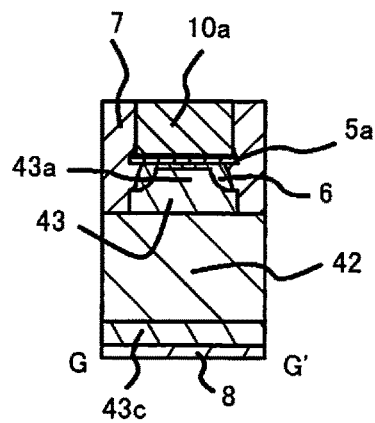
FIG. 8D is a cross-sectional view taken along line G-G' of FIG. 8A.

The connection terminal may be the same width (for example, the length in the shorter dimension of the substrate) at the first main surface, the end surface and/or the second main surface, and may be partially formed with a small or large width. Alternatively, a portion of the connection terminal may be covered by an insulating member (for example, the base material or a solder resist) described below to form a small width on the first main surface and/or the second main surface of the substrate. The small width portion is preferably disposed at least on the first main surface of the substrate (reference is made to the connection terminal 3 in FIG. 3), and may be disposed on both of the first main surface and the second main surface (reference is made to the connection terminal 43 in FIG. 8D and FIG. 8F). In particular, the small width portion is preferably disposed in proximity to the light reflecting member described below on the first main surface of the substrate. The disposition of the small width portion makes it possible to inhibit solder as described below, or flux contained therein, that is connected with the connection terminal, from penetrating along the surface of the connection terminal under the light reflecting member described below to under the light emitting element.

Furthermore, separation of the element connection portion from the end surface that is oriented along the longitudinal direction of the substrate, makes it possible to inhibit solder as described below, or flux contained therein, during mounting of the light emitting device, from penetrating along the connection terminal under the sealing member described below to under the light emitting element.

The small width portion preferably has a smaller width than the element connection portion. Furthermore, the small width portion preferably is configured the small width with smoothly (for example, reference is made to the connection terminal 43 in FIG. 8E).

In case where the connection terminals extend respectively from the first main surface to the second main surface, the extension may be configured on the end surface or may be via a through hole provided in the base material.

In addition to the connection terminal that is electrically connected to the light emitting element, a thermal radiation terminal, a heat sink, a reinforcing member, or the like may be included in the substrate (reference is made for example to the reinforcing member 43c in FIG. 8B and FIG. 9B). These features may be disposed on either of the first main surface, the second main surface and the end surface of the substrate. In particular, such member is preferably disposed below the light emitting element and/or the light reflecting member. In this manner, the strength of the light emitting device is enhanced and reliability can be improved. Furthermore, when the light reflecting member is formed by use of a molding die, distortion of the substrate can be reduced and the molding characteristics of the light reflecting member can be enhanced In case where the thermal radiation terminal or the reinforcing member that made from metal is provided in the interval between connection terminals, it is preferred to cover by an insulating member described below such as a solder resist, or the like, or to provide an insulating film between the respective connection terminals. In this manner, a bridge of molten material between the connection terminal and the thermal radiation terminal or the reinforcing member can be prevented.

In case where a plurality of light emitting elements is disposed on a single light emitting device, at least one further connection terminal may be provided to electrically connect the plurality of light emitting elements. In this configuration, the number of the light emitting elements mounted on a single substrate, their arrangement, connection configuration (parallel or series), or the like can be suitably selected by setting of the shape and position of the connection terminal (reference is made to the terminal 25 in FIG. 6B). This additional connection terminal may include the protruding portion as described above at a position for connection with the light emitting element.

The upper surface of the protruding portion or the first main surface other than the protruding portion of the connection terminal is preferably flat. Furthermore, when the light emitting element is mounted onto the substrate, it is preferred that the surface of the protruding portion and the first main surface of the connection terminal are horizontal with respect to the first main surface of the substrate so that the light emitting surface can be disposed horizontally.

The substrate may itself constitute a capacitor, a varistor, a Zener diode, a bridge diode, or another such protective element, or it may partially include a structure that provides the functions of these elements. If a substrate that has these element functions is used, the light emitting device will be able to function without any special parts being mounted, so a high-performance light emitting device with enhanced electrostatic withstand voltage can be made more compact.

Light Emitting Element

The light emitting element is mounted on the substrate, and is connected with the connection terminal on the first main surface of the substrate.

One light emitting element or a plurality of light emitting elements can be mounted on one light emitting device. The size, shape and light emission wavelength of the light emitting element may be suitably selected. In case where a plurality of light emitting elements is mounted, the arrangement may be irregular, or may have a regular or cyclical configuration such as a matrix arrangement or the like. The plurality of light emitting elements may have a connection configuration such as a series, parallel, serial parallel, or parallel series.

The light emitting element of the present light emitting device is produced as a semiconductor laminate that stacked a first semiconductor layer (such as an n-type semiconductor layer), a light emitting layer, and a second semiconductor layer (such as a p-type semiconductor layer), in that order, for example. On one side (also referred to as the second semiconductor layer side, for example) of the semiconductor laminate, a first electrode that is connected to the first semiconductor layer, and a second electrode that is connected to the second semiconductor layer are disposed. The semiconductor laminate is usually laminated over an element substrate used for growing a semiconductor layer, and may retain this substrate, or the substrate may be removed in final light emitting element.

There are no particular restrictions on the kind and material of the semiconductor laminate. Examples thereof include various kind of semiconductor such as a III-V compound semiconductor, a II-VI compound semiconductor. More specifically, examples thereof include a nitride-based semiconductor material such as $In_XAl_YGa_{1-X-Y}N$ ($0 \leq X$, $0 \leq Y$, $X+Y \leq 1$), InN AlN, GaN, InGaN, AlGaN, InGaAlN, and the like can be used. A known a thickness or a laminated structure of each layer in the art can be used.

The element substrate may be one which can be grown semiconductor layers thereon. Examples of the material for the element substrate include an insulating substrate such as sapphire ($Al_2O_3$) and spinel ($MgAl_2O_4$) and the like, and a semiconductor substrate such as the nitride semiconductor described above. In case where a transparent substrate such as sapphire is used for the element substrate, the element substrate may be employed in the light emitting device without removing from the semiconductor laminate.

The element substrate may have convexes and concaves on its surface.

The surface of the element substrate may have an off angle of about 0 to 10° with respect to a crystalline surface such as C plane or A plane. The substrate may have at least one semiconductor layer such as an intermediate layer, buffering layer, underlying layer, and the like, or at least one insulating layer.

The element substrate for growth of the semiconductor layer can be removed by use of a laser lift off method by illuminating laser light, that passes through the element substrate (for example, a KrF excimer laser), from the element substrate side for growth onto the semiconductor layer to produce a decomposition reaction on the interface between the semiconductor layer and the element substrate and thereby separate the element substrate from the semiconductor layer. However, the element substrate for growth of the semiconductor layer may be completely removed from the semiconductor layer, or some portion of the element substrate may remain in the corner portions or end portions of the semiconductor layer. The removal of the element substrate may be performed before or after the mounting of the light emitting element on the substrate of the light emitting device.

If the element substrate used for growing a semiconductor layer is removed from the semiconductor laminate, the resulting light emitting device will be thinner and more compact. Also, removing any layers that do not contribute directly to light emission prevents the light emitted from the light emitting layer from being absorbed by these layers, so emission efficiency can be increased. As a result, brighter light can be emitted.

There are no particular restrictions on the shape of the semiconductor laminate in a plan view, but a shape that is quadrangle or a similar shape is preferable. The upper limit to the size of the semiconductor laminate can be suitably adjusted according to the size of the light emitting device. More specifically, an example of the length of the semiconductor laminate along one side is from a few hundred microns to about 10 mm.

First Electrode and Second Electrode

The first electrode and the second electrode of the light emitting element are formed on the same surface of the semiconductor laminate (in case where the element substrate for growing the semiconductor layer is present, the opposite side surface of the element substrate). In this manner, flip chip mounting can be used that opposes and bonds the first electrode and the second electrode of the light emitting element, and the positive and negative connection terminals of the substrate respectively.

The first electrode and second electrode can be formed by a single-layer film or a laminate film of Au, Pt, Pd, Rh, Ni, W, Mo, Cr, Ti, Al, Ag or another such metal or an alloy of such metals. More specifically, it can be formed by a laminate film in which Ti/Rh/Au, W/Pt/Au, Rh/Pt/Au, Ni/Pt/Au, Ti/Rh or AlSiCu/Ti/Pt/Au are laminated in that order starting from the semiconductor layer side. The film thickness may be the thickness of any film used in this field.

The first electrode and second electrode preferably have a material layer whose reflectivity to light emitted from the light emitting layer is higher than that of the other material of the electrodes as part of these electrodes on the side closer to the first semiconductor layer and the second semiconductor layer.

An example of a material with high reflectivity is silver, a silver alloy, aluminum, or an aluminum alloy. The silver alloy may be any material that is known in this field. There are no particular restrictions on the thickness of this material layer, but an example is a thickness that allows the light emitted from the light emitting element to be effectively reflected, such as about 20 nm to 1 μm. The greater is the contact surface area of this material layer with the first semiconductor layer or the second semiconductor layer, the better.

In case where silver or a silver alloy is used, the surface thereof (preferably the top face or end surfaces) is preferably covered with a cover layer in order to prevent the migration of the silver. This cover layer can be formed by a metal or alloy that is used as a single-layer film or a laminate film including a conductive material such Al, Cu, Ni or another such metal. Among these, AlCu can be used preferably. The thickness of the cover layer may be from a few hundred nanometers to a few microns, in order to effectively prevent the migration of silver.

As long as the first electrode and second electrode are connected to the first semiconductor layer and second semiconductor layer, respectively, the entire surface of the electrodes need not be touching the semiconductor layer, and part of the first electrode may not be arranged above the first semiconductor layer and/or part of the second electrode may not be arranged above the second semiconductor layer. That is, the first electrode may be arranged above the second semiconductor layer, and the second electrode may be arranged above the first semiconductor layer, via an insulating film or the like. In this arrangement, the shapes of the first electrode and the second electrode are easily changed, therefore mounting the light emitting element to the connection terminals can be easy.

There are no particular restrictions on the insulating film, which may be any single-layer film or laminated film that is used in this field. The first electrode and second electrode can be set to the desired size and position, regardless of the surface area of the first semiconductor layer and/or the second semiconductor layer, by using the above-mentioned insulating film or the like.

The shape of the first electrode and second electrode can be set according to the shape of the semiconductor laminate, the shape of the terminals (in particular, protruding portion), and so forth. For instance, the first electrode and second electrode, and the connection terminals (in particular, the protruding portion) preferably have a shape that is quadrangle or close to quadrangle. Consequently, a self-alignment effect allows for easy positioning and joining of the semiconductor laminate and the substrate. In this case, it is preferable if the planar shapes of the first electrode and second electrode are substantially the same at least at the outermost surface of the semiconductor laminate connected to the substrate. It is also preferable if the first electrode and second electrode are disposed so as to face each other, with the center portion of the semiconductor laminate in between in a plan view.

The first main faces of the first electrode and second electrode (the faces on the opposite side from the semiconductor layer) may have a step, but are preferably substantially flat. The term "flat" here means that the height from the second main face of the semiconductor laminate to the first main face of the first electrode, and the height from the second main face of the semiconductor laminate to the first main face of the second electrode are substantially the same. The phrase "substantially the same" here encompasses variation of about ±10% in the height of the semiconductor laminate.

The light emitting element will be easier to mount horizontally on the substrate if the first main faces of the first electrode and second electrode are substantially flat, that is, substantially in the same plane. To form the first electrode and second electrode in this way, for example, a metal film is provided by plating or the like over the electrodes, after which this is polished or cut so that the surfaces lie in substantially the same plane.

A DBR (distributed Bragg reflector) may be disposed between the first electrode and second electrode and their respective first semiconductor layer and second semiconductor layer, to the extent that this does not impair electrical connection of these. A DBR is a multilayer structure in which a low refractive index layer and a high refractive index layer are laminated over an under layer composed of an oxide film or the like, and selectively reflects light of a specific wavelength. Specifically, a specific wavelength can be reflected very efficiently by alternately laminating films of different refractive indexes at a thickness of a quarter of the specific wavelength. The DBR can be formed of layers including an oxide film or nitride film selected from Si, Ti, Zr, Nb, Ta, Al or the like.

Molten Material

The first electrode and the second electrode of the light emitting element are normally bonded with the connection terminal of the substrate described above by use of a bonding agent. In the one embodiment, the first electrode and the second electrode of the light emitting element are bonded to the connection terminal of the substrate described above by a molten material as an bonding agent, and in particular are bonded onto the protruding portion, and may also be bonded onto the side surface of the protruding portion. The bonding agent and the molten material may be any material that is known in this field. More specifically, the bonding agent includes solder such as tin-bismuth solder, tin-copper solder, tin-silver solder and gold-tin solder, or the like, and a conductive pastes of silver, gold, palladium, or the like, a bump, anisotropic conductive materials, and a brazing filler metal such as low melting point metals, or the like. The molten material includes materials that are melted by heating, for example, the solders described above, or a brazing material such as a low melting point metal. The use of solder facilitates mounting of the light emitting element to a suitable position due to the self-alignment effect, enables an increase in manufacturing performance, and enables the manufacture of a smaller light emitting device.

The molten material may cover at least the upper surface of the protruding portion if the light emitting device has the protruding portion. The molten material may cover the whole or a portion of the side surface of the protruding portion, and the first main surface of the connection terminal on the peripheral side of the protruding portion.

Light Reflecting Member/Sealing Member

The light reflecting member exhibits light reflecting characteristics, and is a member to cover, fix or seal at least the light emitting element. Furthermore, it embeds the molten material and the protruding portion of the connection terminal described above. A position on the protruding portion of the connection terminal that is not covered by the molten material and a position of the molten material that is not in contact with the electrode of the light emitting element, and a position of the light emitting element facing the substrate and not being in contact with the molten material, and the whole of that side surfaces are preferably placed in contact with and covered by the light reflective member. This type of arrangement enables light emitted from the light emitting element to avoid being absorbed by the substrate, the connection terminal and the molten material, or the like, and enables light emitted from the light emitting element to extract efficiently to the light extraction surface side.

The sealing member is a member that fixes or seals at least the light emitting element. The sealing member preferably exhibits light reflecting characteristics, and more preferably has the same function as the above light reflecting member.

There are no particular restrictions on the material of the light reflecting member and the sealing member, examples thereof include ceramics, resin, dielectrics, pulp, glass or the its complex material. Among these, a resin is preferable to easily form the desired shape.

Examples of the resin include a thermosetting resin and a thermoplastic resin. Specific Examples of such a resin include an epoxy resin composition; a silicone resin composition; a modified epoxy resin composition such as a silicone modified epoxy resin; a modified silicone resin composition such as an epoxy modified silicone resin; a polyimide resin composition, a modified polyimide resin composition, polyphthalamide (PPA), a polycarbonate resin; a polyphenylene sulfide (PPS); a liquid crystal polymer (LCP); an ABS resin (an acrylonitrile-butadiene-styrene resin); a phenolic resin; an acrylic resin; and a PBT resin (polybutylene terephthalate resin).

The light reflecting member and the sealing member are preferably formed by a material so that its reflectivity of light from the light emitting element will be at least 60%, and preferably at least, 70%, 80%, or 90%.

Therefore, it is preferred that the above material, for example, the resin include a light reflecting material such as titanium dioxide, silicon dioxide, zirconium dioxide, potassium titanate, alumina, aluminum nitride, boron nitride, mullite, niobium oxide, barium sulfate, various rare earth oxides (e.g., yttrium oxide, gadolinium oxide, etc.), and may be include a colorant such as carbon black and the like.

In this manner, the light from the light emitting element can be efficiently reflected. In particular, the use of a material that exhibits higher reflectivity than the substrate (for example, in case where aluminum nitride is used in the substrate, a silicon resin containing titanium dioxide is used as the light reflecting member) maintains handling characteristics, enables downsizing of the substrate, and further increases the light extraction efficiency of the light emitting device.

The light reflecting member and the sealing member may also contain a fibrous filler such as glass fibers, wollastonite, an inorganic filler such as carbon, or the like. The light reflecting member and the sealing member may contain a material having a high heat dissipation such as aluminum nitride and the like. Further, the light reflecting member and the sealing member may include a fluorescent material described below. In case where these additives are used, it is preferably to contain 10 to 40 weight % with respect to the total weight of the light reflecting member and the sealing member.

In this manner, It is possible to reinforce the light reflecting member during processes such as the removal and peeling of the substrate for use of growth of the semiconductor layer, or the like, and/or the light emitting device.

Furthermore, the use of a material having high thermal radiation characteristics is adapted to enable downsizing of the light emitting device and to enhance thermal radiation characteristics.

There is no particular limitation in relation to the shape of the light reflective member and the sealing member, and for example it includes polygonal columnar configurations such as circular cylinders, square columns, or the like, or shapes approximate thereto, or polygonal truncated configurations such as truncated cones, truncated pyramid, or the like. Of those shapes, a shape are preferred that elongates with reference to the longitudinal direction of the substrate. Furthermore, it is preferred that a surface is provided along the short direction of the substrate.

The light reflective member or the sealing member are preferably provided to surround the entire periphery (side surfaces) of the light emitting element. Furthermore it is preferred that the member is provided to fill the space between the substrate and the light emitting element mounted in a flip chip manner. In this manner, the strength of the light emitting device can be increased. In case where providing the light reflective member and the sealing member to surround the entire periphery (side surfaces) of the light emitting element, the light reflective member and the sealing member preferably form a thick in relation to the longitudinal direction of the light emitting device and a thin in relation to the short direction. In this manner, the width of the light emitting device can reduced. In the one embodiment, the light reflective member or the sealing member are preferably contacted with an insulating member described below, and is provided between the light emitting element and the insulating member.

The edge portion when viewed in a plan view of the light reflective member or the sealing member may be disposed at a position further outside or inside of the edge portion of the substrate. In case where the light reflective member or the sealing member have a shape that is elongated in relation to a longitudinal direction of the substrate, one edge portion along the longitudinal direction preferably coincides with the edge portion along the longitudinal direction of the substrate. That is to say, at least one of the end surface along the longitudinal direction of the light reflective member or the sealing member preferably form a coplanar surface with one of the end surface along the longitudinal direction of the substrate. It is still more preferred that both of the end surfaces along the longitudinal direction of the light reflective member and the sealing member form a coplanar surface with both of the end surfaces along the longitudinal direction of the substrate. In this manner, the surface area of the light extraction surface can be increased without increasing in the width of the light emitting device, and therefore it is possible to increase the light extraction efficiency of the light emitting device. The edge portion along the short direction of the light reflecting member or the sealing member may be disposed on an outer side with reference to the edge portion along the short direction of the substrate and may be disposed on an inner side.

In case where the light emitting device is mounted in a side-view type configuration, the width in the short direction of the light reflecting member or the sealing member and the substrate is preferably 0.2 mm to 0.4 mm.

The size of the light reflective member and the sealing member preferably is configured with a larger surface area than the light emitting element, and in particular it is preferred to exhibit a size in which the length of one side is 2 to 5 times that of one side of the light emitting element. The thickness for example is of the order of 50 to 300 microns.

The light reflective member and the sealing member may be formed by screen printing, potting, transfer molding, compression molding, or the like.

The light reflective member and the sealing member may be provided to cover the upper surface or the side surface of the light emitting element prior to mounting of the light emitting element on the substrate. However, it is preferred to perform formation after mounting of the light emitting element on the substrate in order to seal or cover the surface of the light emitting element that faces the substrate, and the whole surface on the side surface of the light emitting element.

Insulating Member

In the one embodiment, the light emitting device preferably includes an insulating member.

The insulating member is preferably placed in contact with the light reflecting member or the sealing member, is disposed to cover at least a portion of the connection terminal, and is disposed between the element connection portion and the outer connection portion of the connection terminal. In this manner, as described below, when mounting the light emitting device on the mounting board, it is possible to avoid penetration of solder along the surface of the connection terminal and thereby avoid a reduction in the reliability of the light emitting device.

It is preferred that the insulating member is disposed to totally separate the surface region of the connection terminal between the element connection portion and the outer connection portion. Furthermore, it is preferred to dispose on the connection terminal so that the edge portion of the light reflecting member or the sealing member is disposed on the insulating member. In this manner, the adhesion property between the light reflecting member or the sealing member and the substrate can be enhanced, and a risk of peeling of the light reflecting member or the sealing member can be reduced. In particular, as described above, in case where the light reflecting member or the sealing member has a shape that is elongated with reference to the longitudinal direction, it is preferred that the edge portion in the longitudinal direction of the light reflecting member or the sealing member is disposed on the insulating member that disposed on the connection terminal. Consequently, that when the substrate becomes warped or bent, the risk of peeling of the light reflecting member or the sealing member can be reduced. Furthermore, as described above, the connection terminal may not always be configured with the same width on the first main surface, and therefore a portion of the insulating member may be disposed not only on the connection terminal but also on the base material.

A pair of insulating members may be provided to respectively cover the pair of connection terminals, or may be configured to connect and cover the pair of connection terminals.

As long as the insulating member exhibits insulating properties, formation by use of any appropriate material is possible. For example, a material given by example in relation to the light reflecting member and the sealing member described above, or the light transmissive member described below can be used. Of those materials, a white silicon resin that has high heat resistance performance is preferred.

There is no particular limitation on the shape of the insulating member. However it is preferred that formation is in the shape of a band connected from the adjacent position to the element connection portion to the outer side of the light reflecting member and the sealing member, that is to say to the outer connection portion.

More specifically, the length of the insulating member in the longitudinal direction can be a length of $\frac{1}{10}$ to $\frac{1}{5}$ of the light reflecting member and the sealing member.

It is preferred that the width of the insulating member is the same as the width of the substrate and/or the light reflecting member or the sealing member.

That width enables a surface of the insulating member to be coplanar with one end surface of the substrate and/or the light refracting member or the sealing member, and furthermore enables two opposing surfaces of the insulating member to be coplanar with end surfaces of each of the substrate and the sealing member.

In particular, in case where there is a position at which the connection terminal is configured with a small width, it is preferred that the position having the small width is completely covered with the insulating member. In this manner, as described below, penetration of solder along the connection end surface and the resulting adverse effect on the reliability of the light emitting device can be avoided when mounting the light emitting device on the mounting board.

The insulating member can be formed by a method of adhering a material as described above in a sheet configuration, a printing method, an electrodeposition method, potting, compression molding, spraying, an electrostatic coating method, or the like.

There is no particular limitation on the thickness of the insulating member, and for example, it may be configured at about 10 to 300 microns.

When using a die to mold the light reflecting member or the sealing member, the insulating member is preferably formed by connection from below the light reflecting member and the sealing member to the outer connection portion side. In this manner, it is possible to prevent contact of the die used for molding of the light reflecting member and the sealing member with the connection terminal and therefore avoid damage to the connection terminal.

Light Transmissive Member

It is preferred that the light transmissive member is disposed on the light extraction surface of the light emitting device to cover the light extraction surface of the light emitting element.

The light transmissive member may be formed by the same member as the light reflecting member and the sealing member, or may be a different member.

The end surface of the light transmissive member may coincide with the end surface of the light reflecting member or the sealing member, or the end surface of the light transmissive member may be covered by the light reflecting member or the sealing member. The disposition of the light transmissive member in this manner enables light extracted from the light emitting element to be introduced efficiently to the light emitting surface.

The light transmissive member allows penetration of light, which is 60% or greater of light emitted from the light emitting layer, and further preferably allows penetration of 70% or greater, 80% or greater, or 90% or greater of light emitted from the light emitting layer. Such member can be formed by a material such as a resin, for example, a silicone resin, a modified silicone resin, an epoxy resin, a modified epoxy resin phenolic resin, polycarbonate resin, acrylic resin, TPX resin, polynorbornene resin, or hybrid resin containing one or more of these resins, and glass and the like. Of those materials, use of a silicon resin that exhibits good heat resistance and light resistance is preferred.

It is preferred that a fluorescent material is included in the light transmissive member.

As the fluorescent material that is known in this technical field can be used, and includes for example, a YAG-based fluorescent material activated by cerium, LAG-based fluorescent material activated by cerium, a carcium aluminosilicate containing nitride fluorescent material activated by europium or chromiun ($CaO-Al_2O_3-SiO_2$), a silicate fluorescent material activated by europium ($(Sr,Ba)_2SiO_4$), beta sialon fluorescent material, KSF fluorescent material ($K_2SiF_6$:Mn), minute semiconductor particles that are termed quantum dot fluorescent material, and the like. In this manner, it is possible to obtain a light emitting device that emits mixed colored light containing a primary light and a secondary light in visible wavelengths (for example, white light), and to obtain a light emitting device that is excited by ultraviolet primary light to thereby emit secondary light in visible wavelengths. In case where the light emitting device is used in a backlight for a liquid crystal display, use is preferred of a fluorescent material excited by blue light emitted from the light emitting element to thereby emit red light (for example, a KSF fluorescent material), and a fluorescent material that emits green light (for example, beta SiAlON fluorescent material). In this manner, the color reproduction range of the display can be increased.

The fluorescent material is not limited to inclusion in the above members, and may be provided in a variety of positions and members in the light emitting device. For example, formation is possible to cover the light emitting element without the light transmissive member and may be provided as a fluorescent layer coated and adhered onto the light transmissive member that does not contain the fluorescent material.

The light transmissive member may further include filling agent (for example, a dispersing agent, a coloring agent, and the like). Examples thereof include silica, titanium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black. The refractive index of the filling agent may be adjusted as required, and for example includes at least 1.8, with at least 2 being preferred and at least 2.5 being more preferred in order to obtain high light extraction efficiency by efficient refraction of light.

The shape of the particles of the filling agent may be any of granular, spherical, hollow, porous, or the like. The average particle diameter (median diameter) of the particles is preferably about 0.08 to 10 microns in order to obtain a highly efficient light dispersal effect.

The filling agent for example is preferably about 10 to 60 wt % relative to the weight of the light transmissive member.

A method for forming the light transmissive member is a method by forming a sheet of the light transmissive member and attaching it using hot-melt adhesive or an adhesive agent, potting, compression molding, spray, electrostatic coating, printing and the like. Silica (aerogel) may be added to the light transmissive member in order to adjust viscosity or flowability.

There is no particular limit on the thickness of the light transmissive member and for example may be configured at about 10 to 300 microns. This thickness setting enables light extracted from the light emitting element to be guided efficiently to the light emitting surface of the light emitting device even when the end surface of the light transmissive member coincides with the end surface of the light reflecting member, or even when covered by the light reflecting member.

The light transmissive member may be configured with the first main surface and/or the second main surface as an uneven surface such as a protruding surface or a recessed surface in order to control the light distribution.

The light transmissive member can be adhered to the upper surface of the light emitting element before mounting of the light emitting element onto the substrate and set on the light emitting device. In particular, in case where the light emitting element is configured by a semiconductor laminated body in which the element substrate for growth of the semiconductor layer is removed, for example, the strength of the light emitting element is increased by adhesion or fixing to a hard light transmissive member such as glass, ceramic, or the like, and therefore the reliability of the mounting of the light emitting element and the handling performance can be increased.

The light emitting device of the present disclosure will now be described in detail through reference to the drawings.

First Embodiment

Figure 2:
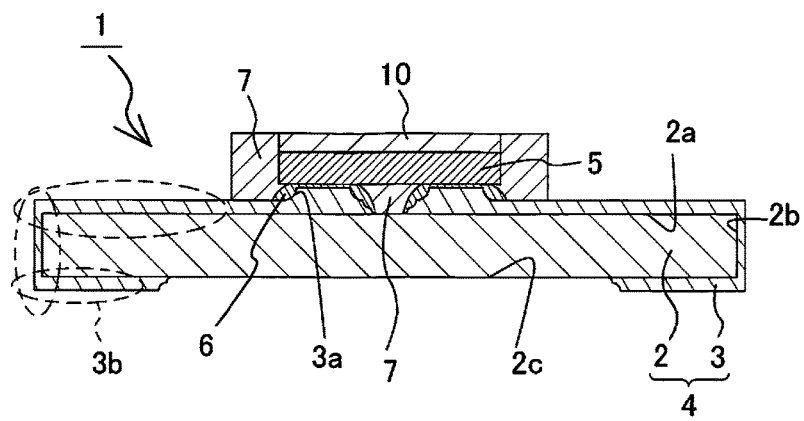
FIG. 2 is a cross-sectional view taken along line A-A' of the light emitting device of FIG. 1.

As illustrated in FIG. 1 to FIG. 3, the light emitting device 1 of the present embodiment has a substrate 4 that has a connection terminal 3, a light emitting element 5, and a light reflective member 7.

The substrate 4 has a pair of connection terminals 3 formed by laminating Cu/Ni/Au from the base material 2 side onto the surfaces (the upper surface 2a that is the first main surface, and end surfaces 2b that extend in the direction of the short dimension, and the lower surface 2c that is the second main surface) of the rectangular parallelepiped base material 2 that is formed by a glass epoxy resin. The substrate 4 is served as a wiring base and has a length in a longitudinal direction of 2.2 mm, a width in the short dimension direction of 0.4 mm and a thickness of 0.3 mm.

The pair of connection terminals 3 includes protruding portions 3a served as an element connection portion in a mutually adjacent configuration on a central portion of the upper surface 2a side of the base material 2. The protruding portion 3a is formed by laminating Cu/Ni/Au from the base material 2 side. The pair of connection terminals 3 extends respectively from the protruding portion 3a that is the element connection portion in the longitudinal direction, from the upper surface 2a of the base material 2 through respective end surface 2b to lower surface 2c of the substrate. A portion of the each connection terminals 3 that is positioned to extend from the protruding portion 3a that is the element connection portion and to connect with the lower surface 2c of the base material 2 (position in the shape of a letter U when viewed in cross section) is served as the outer connection portion 3b (reference is made to FIG. 2).

The edge portion along the longitudinal direction of each the connection terminal 3 (specifically the outer connection portion) coincides with the edge portion along the longitudinal direction of the substrate 4, and the end surface along the longitudinal direction of the connection terminal 3 (specifically the outer connection portion) is formed coplanar with the end surface along the longitudinal direction of the substrate 4.

Each the connection terminal 3 includes a small width portion between the protruding portion 3a that is the element connection portion and the outer connection portion 3b (reference is made to FIG. 3). A portion of the outer connection portion 3b on the second main surface of the substrate 4 includes a small width portion.

A light emitting element 5 is mounted on the protruding portion 3a of the substrate 4 in flip chip manner.

The light emitting element 5 includes a laminated body (semiconductor laminate) of a nitride semiconductor formed on a sapphire substrate, and a pair of positive/negative electrodes on the surface that is opposite to the sapphire substrate of the laminated body. The pair of positive/negative electrodes of the light emitting element 5 is connected by the molten material 6 that is an Au—Sn eutectic solder to the protruding portions 3a of the pair of connection terminals 3 on the substrate 4.

In case where the protruding portion 3a of the connection terminal is used in this manner, even if molten material 6 in a molten configuration as described below flows from on top of the protruding portion during mounting of the light emitting element, the material can be accommodated in the periphery of the protruding portion, and shorting of the pair of connection terminals and penetration of the molten material into an unintended area can be prevented. Therefore accurate fixation of the light emitting element to the target position is enabled.

The light emitting element 5 is an LED chip that emits blue light (central emission wavelength of 455 nm) in a rectangular parallelepiped configuration with a length in a longitudinal direction of 0.8 mm, a width in the short direction of 0.3 mm and a thickness of 0.1 mm.

The light reflecting member 7 is formed substantially in a rectangular parallelepiped configuration with a length in a longitudinal direction of 1.2 mm, a width in the short direction of 0.4 mm and a thickness of 0.3 mm. The edge portions along the longitudinal direction of the light reflecting member 7 respectively coincides with the edge portions along the longitudinal direction of the substrate 4.

The light reflecting member 7 is provided on the first main surface of the substrate 4 in contact with the light emitting element 5 and to thereby cover the entire periphery of the end surface of the light emitting element 5. Furthermore, the light reflecting member 7 is also provided on the side of the surface facing the substrate 4 of the light emitting element 5. That is to say, disposition of the light reflecting member 7 is performed in the interval with the molten material 6 that substantially completely covers the protruding portion 3a, and substantially completely covers the surface of the molten material 6. In this manner, efficient light extraction is enabled on the upper surface from the light emitting element 5.

The light reflecting member 7 is formed by a silicon resin contains silica having an average particle diameter of 14 microns and titanium oxide having an average particle diameter of 0.25 microns to 0.3 microns are respectively composed as 2 to 2.5 wt % and 40 to 50 wt % relative to the total weight of the light reflecting member 7.

A portion of the small width portion of the connection terminal 3 and a portion of the outer connection portion are exposed from the light reflecting member 7 on both sides of the light reflecting member 7 on the substrate 4. The edge portion along the longitudinal direction of the light reflecting member 7 coincides with the edge portion along the longitudinal direction of the substrate 4, and the end surface along the longitudinal direction of the light reflecting member 7 is formed coplanar with the end surface along the longitudinal direction of the substrate 4.

A light transmissive member 10 configured as a sheet of silicon resin (thickness 0.1 mm) that includes a YAG:Ce fluorescent material is disposed on the light emitting element 5, that is to say, on the surface opposite the pair of positive and negative electrodes.

The end surface of the light transmissive member 10 is covered by the light reflecting member 7. The upper surface of the light transmissive member 10 and the upper surface of the light reflecting member 7 are formed in a coplanar configuration.

Figure 4:
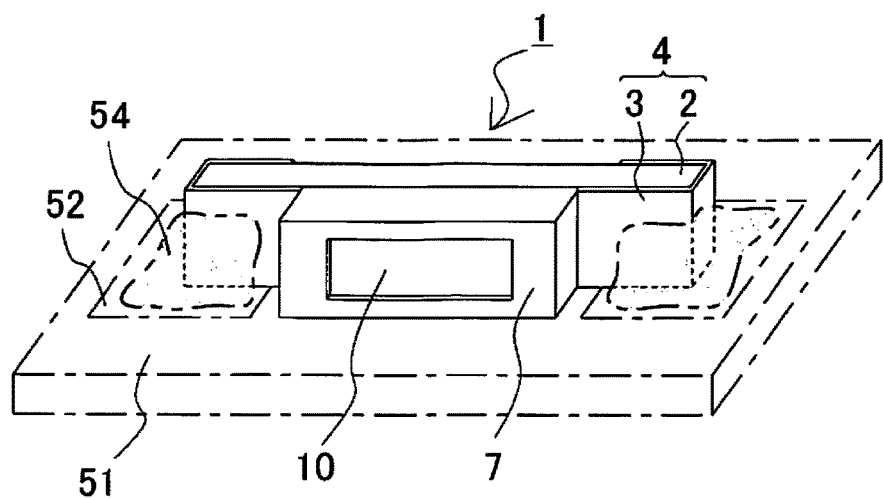
FIG. 4 is a schematic perspective view illustrating the light emitting device of FIG. 1 which is mounted on a mounting board.

As illustrated in FIG. 4, the pair of end surfaces along the longitudinal direction of the substrate 4 and the pair of end surfaces along the longitudinal direction of the light reflecting member 7 of the light emitting device 1 are disposed respectively in a coplanar configuration. One of the end surfaces in the coplanar configuration 52 and is configured as a mounting surface of the light emitting device 1, and is mounted in a side-view configuration on the mounting board 51 that has a surface wiring pattern.

The mounting of the light emitting device 1 is configured so that the pair of outer connection portions 3b of the light emitting device 1 is respectively disposed on the wiring pattern 52 corresponding to the positive and negative electrodes of the mounting board 51, and is connected by solder 54. The solder 54 extends over the end surface and the second main surface in addition to the first main surface of the substrate 4 on the outer connection portion 3b that is curved in the shape of the letter U. In this manner, a fillet can be formed on the side surface of the light emitting device and thereby enhances the mounting stability and thermal radiation performance of the light emitting device.

In this embodiment, small width portion between the protruding portion 3a and the outer connection portion 3b on the connection terminal 3 suppresses penetration of solder or the like as described above and flux or the like contained therein that are connected with the outer connection portion 3b under the light reflecting member 7.

Both one of the end surface along the longitudinal direction of the substrate 4 and one of the end surface along the longitudinal direction of the light reflecting member 7 are in contact with the surface of the mounting board 51.

In this embodiment, the light reflecting member 7 itself is provided with an extremely thin wall configuration on the periphery of the light emitting element 5, and therefore it is possible to downsize the light emitting device. Furthermore, the disposition of the light reflecting member 7 in contact with the periphery of the light emitting element enables extraction of light emitted in a horizontal direction of the light emitting from the light emitting element for reflection in an upward by the light reflecting member 7. Therefore, the use efficiency of the light can be enhanced.

Figure 5A:
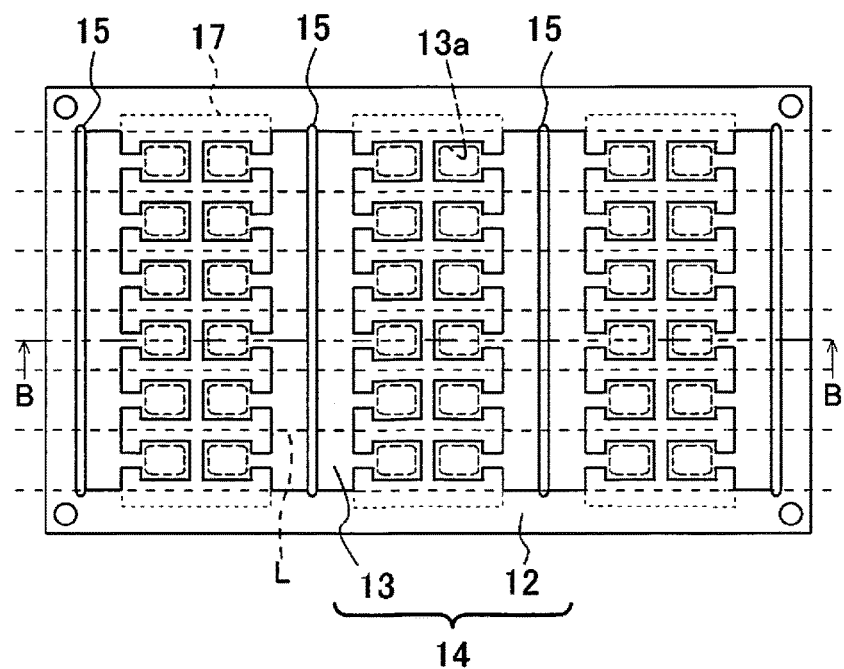
FIG. 5A is a schematic perspective plan view illustrating a method of the light emitting device of FIG. 1.
Figure 5B:
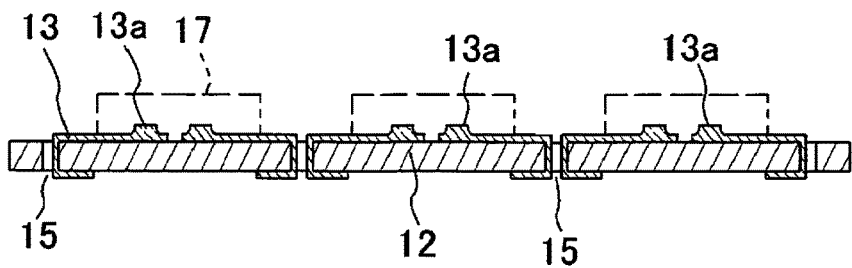
FIG. 5B is a cross-sectional view taken along line B-B' of FIG. 5A.

As illustrated in FIG. 5A and FIG. 5B, the light emitting device 1 enables manufacture by use of an aggregate substrate 14 that forms an aggregate connection terminal 13 on the base material 12. The aggregate substrate 14 is configured by connection of a plurality of units that form the substrate of each light emitting device after the processing of unit formation.

In this embodiment, the aggregate substrate 14 includes slits 15 from the upper surface to the lower surface on the base material 12. The aggregate connection terminal 13 is provided on the upper surface and the lower surface of the base material 12 of the aggregate substrate 14 through the inner wall of the slit 15.

Although FIG. 5 shows the aggregate substrate 14 which forms eighteen light emitting devices, the aggregate substrate 14 can be configured to form more numerous (several hundred to several thousand) light emitting device 1A when manufacture efficiency is considered.

A plurality of insulated member are formed on the aggregate substrate 14 in a single operation. Then a plurality of light emitting element 5 are connected on the aggregate substrate 14, and a plurality of light transmissive member 10, that has substantially the same shape as the light emitting element 5 when viewed in plan, is adhered onto the upper surface of each light emitting element 5. A plurality of light reflecting members 17 is formed in a single operation by use of compressive molding to cover the end surface of the light transmissive member and the light emitting element. Then the aggregate substrate 14 and the light reflecting member 17 are cut in a single direction along the predetermined dividing lines L which intersect with the slits 15 at substantially right angles. In this manner, division along the direction of extension of the slits 15 is enabled to obtain a plurality of singulated light emitting devices separated into units in comparatively few processing steps.

A dicer, a laser, or the like can be used in the cutting process.

Second Embodiment

Figure 6:
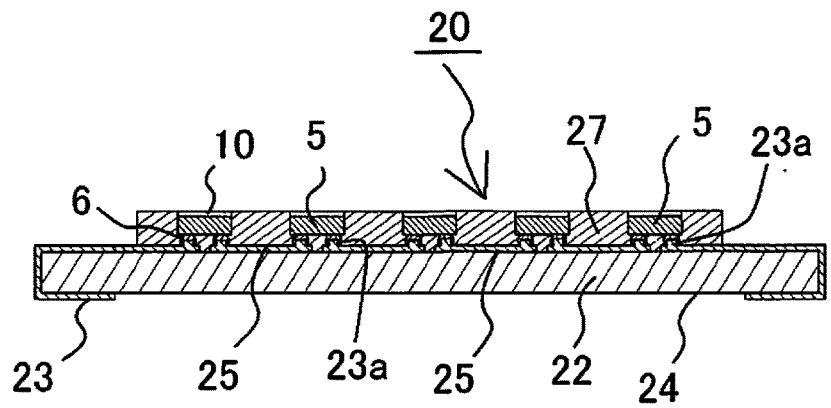
FIG. 6 is a schematic cross-sectional view illustrating a light emitting device according to another embodiment of the present invention.

As illustrated in FIG. 6, the light emitting device 20 according to this embodiment includes a substrate 24 that has a connection terminal 23, a plurality of light emitting elements 5, and a light reflecting member 27.

The connection terminal 23 is disposed to extend to the upper surface, the end surface and the lower surface on both sides in the longitudinal direction of the base material 22. Furthermore, a plurality of light emitting elements 5 is connected for example in series and further terminals 25 are disposed on the upper surface of the base material 22.

The connection terminal 23 and the further terminals 25 on the same surface of the substrate 24 respectively include the protruding portions 23a as an element connection portion, and the light emitting elements 5 are connected by molten material 6 on the protruding portions 23a.

In this embodiment, a plurality of light emitting elements 5 is disposed by alignment into a line. Arrangement is also possible into a matrix configuration.

The light reflecting member 27 integrally cover the plurality of light emitting element 5. Each end surface along the longitudinal direction of the light reflecting member 27 is formed coplanar with each end surface along the longitudinal direction of the substrate 24. Each edge portion facing the short direction of the light reflecting member 27 is disposed on the inner side of the substrate 24.

It is preferred that a recessed portion or through hole is formed in the substrate 24 between the light emitting elements 5, and a portion of the light reflecting member 27 is filled into the recessed portion or the through hole to thereby fix the light reflecting member 27 to the substrate 24. In this manner, the adhesion property between the light reflecting member 27 and the substrate 24 are enhanced, and it is possible to prevent peeling of the light reflecting member 27 from the substrate 24.

Features other than those described above are substantially the same as the first embodiment, and therefore the same effect as the first embodiment can be imparted.

Furthermore, the light emitting device can be used as a linear or matrix type side-view light emitting device. Therefore, the light emitting device enhances mounting accuracy in comparison to mounting individual side-view light emitting devices on a mounting board respectively. Furthermore, alignment characteristics with the light guide plate are enhanced when functioning as a backlight light source for example.

Third Embodiment

Figure 7:
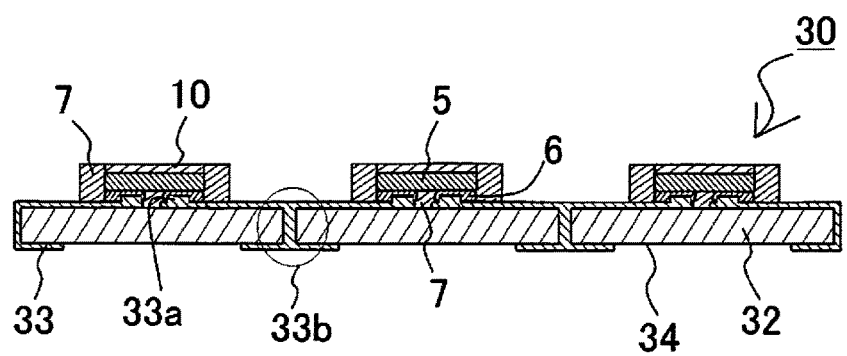
FIG. 7 is a schematic cross-sectional view illustrating a light emitting device according to still another embodiment of the present invention.

As illustrated in FIG. 7, the light emitting device 30 according to the present embodiment is configured by arranging a plurality of light emitting device according to the first embodiment, that is to say, a light emitting device including a protruding portion 33a as an element connection portion on the pair of connection terminal 33, into the direction of a row or a matrix, in a configuration that the light emitting devices are connected each other so that they share the adjacent connection terminals 33, and in particular the outer connection portion 33b. Through holes are provided in the base material 32 between adjacent light emitting elements 5, and a plurality of connection terminal 33 of the substrate 34 is drawn towards the lower surface side of the substrate 34 through the through holes.

Features other than those described above are similar to the first embodiment. Therefore, the same effect as the first embodiment and the second embodiment can be imparted.

Fourth Embodiment

As illustrated in FIG. 8A to FIG. 8G, the light emitting device 40 according to the present embodiment includes a connection terminals 43 extends from the first main surface of the base material 42 through respective end surface to the second main surface, is formed by Cu/Ni/Au (thickness 20 microns), further includes a layer of Cu (thickness 20 microns) on the first main surface and the second main surface, and furthermore includes a protruding portion 43a of Cu as a connection terminal portion (thickness 40 microns).

The connection terminals 43 firstly is formed by performing film formation in a predetermined shape by Cu plating to a position corresponding to the protruding portion 43a of the base material 42, and thereafter, masking the end surface and forming Cu plating on the first main surface and the second main surface including the Cu protruding portion. Then, the mask of the end surface is removed, and Ni/Au are plated onto the first main surface, the end surface and the second main surface to thereby enable formation of the connection terminal 43.

The substrate includes a reinforcing terminal 43c on the second main surface corresponding to the mounting region of the light emitting element 5a.

The second main surface of the substrate is covered by an insulating film 8 from a portion in proximity to the central portion of the substrate of the pair of connection terminal 43 and across the base material 42 and the reinforcing terminal 43c.

Figure 8E:
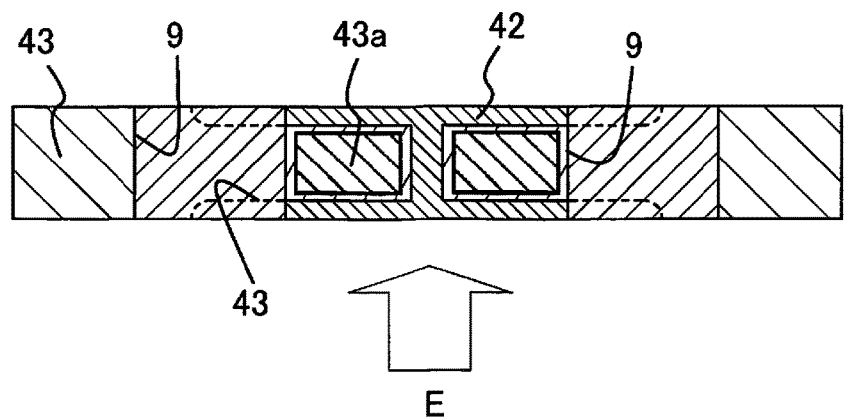
FIG. 8E is a plan view of a substrate in the light emitting device of FIG. 8A.
Figure 8F:
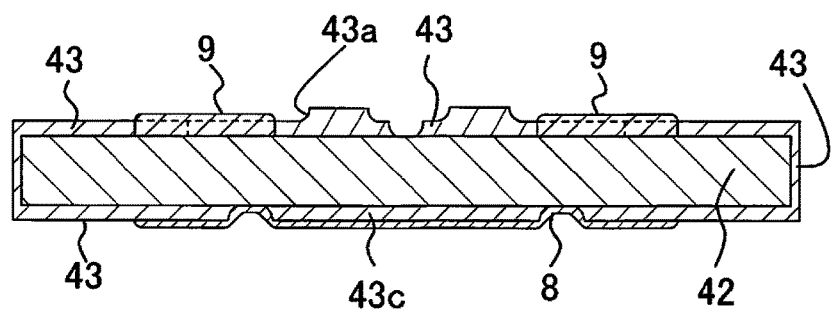
FIG. 8F is a perspective view of the substrate viewed from a side of arrow E of FIG. 8E.
Figure 8G:
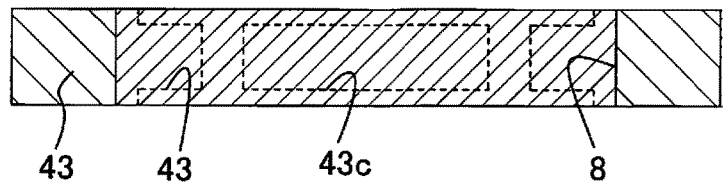
FIG. 8G is a perspective back side view of the substrate of FIG. 8E.
Figure 9E:
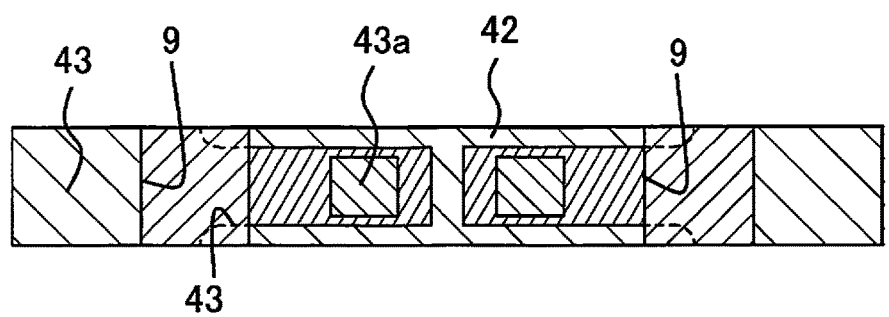
FIG. 9E is a plan view of a substrate in the light emitting device of FIG. 9A.

As illustrated in FIG. 8E, a portion of the connection terminal 43 is formed with a small width on the first main surface of the substrate. Furthermore, as illustrated in FIG. 8G, a portion of the connection terminal 43 is also formed with a small width on the second main surface.

As illustrated in FIG. 8C, the light emitting element 5a is formed by a pair of electrodes and a semiconductor laminated body, and then the substrate for growth of the semiconductor layer is removed. The removal of the element substrate for growth of the semiconductor layer, for example, can be performed by use of a laser lift off method or the like by mounting a light emitting element 5 that has the element substrate for growth of the semiconductor layer on a pair of connection terminals, disposing the light reflecting member 7 and then irradiating laser light (for example, a KrF excimer laser) onto the semiconductor layer from the sapphire substrate side to thereby produce a decomposition reaction on the interface between the semiconductor layer and the sapphire substrate and separate the sapphire substrate from the semiconductor layer. At that time, the semiconductor layer for the light emitting element is covered by the light reflecting member 7, and furthermore the light emitting element can be accurately fixed by covering both the molten member 6 and the protruding portion 43a of the connection terminal 43. Therefore, the stress produced by illumination of laser light can be reduced, and it is possible to efficiently remove the sapphire element substrate from the semiconductor layer.

The pair of electrodes on the light emitting element 5a is bonded by the molten material 6 that is configured from an Au—Sn eutectic solder and the protruding portion 43a of the connection terminal 43. The first main surface of the light emitting element 5a includes a ceramic plate that contains a fluorescent material and is configured by a light transmissive member 10a fixed by light transmissive silicon resin adhesive. The end surface of the light transmissive member 10a is covered by the light reflecting member 7.

An insulating member 9 is disposed on the connection terminal 43 between the protruding portion 43a and the outer connection portion. The insulating member 9 is formed substantially in a rectangular parallelepiped configuration with a length in a longitudinal direction of 0.5 mm, a width in the short direction of 0.4 mm and a thickness of 0.02 mm. The insulating member 9 is exposed by 0.3 mm in a longitudinal direction from the end surface of the light reflecting member 7. The insulating member 9 covers the small width portion and the periphery of the connection terminal 3.

The edge portion facing the longitudinal direction of the light reflecting member 7 is disposed on the insulating member 9, and the edge portion along the longitudinal direction of the light reflecting member 7 coincides with the edge portion along the longitudinal direction of the insulating member 9. Furthermore, the edge portion along the longitudinal direction of the insulating member 9 coincides with the edge portion along the longitudinal direction of the substrate, and the end surface along the longitudinal direction of the insulating member 9 is formed to be coplanar with the end surface along the longitudinal direction of the substrate. The insulating member 9 is formed from white silicon resin containing titanium dioxide.

In case where disposing the insulating member in this manner, as described below, if the light emitting device is mounted on the mounting board in a side-view configuration, it is possible to avoid penetration of solder along the surface of the connection terminal and thereby avoid a reduction in the reliability of the light emitting device. Furthermore, when connecting the light emitting element to the connection terminal by the molten material, it is possible to prevent leakage of the molten material from the protruding portion and the adjacent area thereto onto the outer connection portion.

Features other than those described above are similar to the first embodiment, and therefore the same effect as the first embodiment can be imparted.

Fifth Embodiment

As illustrated in FIG. 9A to FIG. 9E, the light emitting device 50 of the present embodiment is such that a translucent glass plate and a fluorescent material layer 10c coated by spraying onto the surface of the plate are disposed as a light transmissive member 10b on the light emitting element 5.

Features other than those described above are similar to the fourth embodiment, and therefore the same effect as the fourth embodiment can be imparted.

Sixth Embodiment

Figure 10:
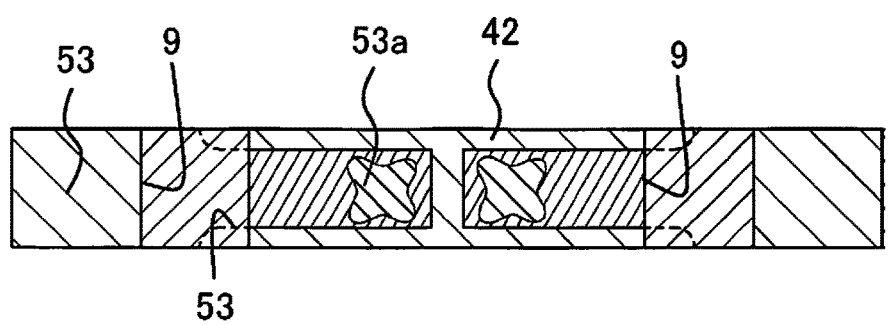
FIG. 10 is a schematic plan view illustrating a shape of a protruding portion of a connection terminal in the light emitting device according to still another embodiment of the present invention.

As illustrated in FIG. 10, the light emitting device of the present embodiment has similar configuration to the light emitting device according to the fourth and the fifth embodiments with the exception that the planar shape of the protruding portions 53a in the connection terminal 53 is formed in the shape of a letter X. Therefore, the same effect as the first, fourth and fifth embodiments can be imparted. In addition, the formation of the shape of the protruding portion in the shape of a letter X facilitates storage of the molten material in a recessed position when viewed in plan and enables further ensure an accurate and strong connection with the light emitting element.

Seventh Embodiment

Figure 11:
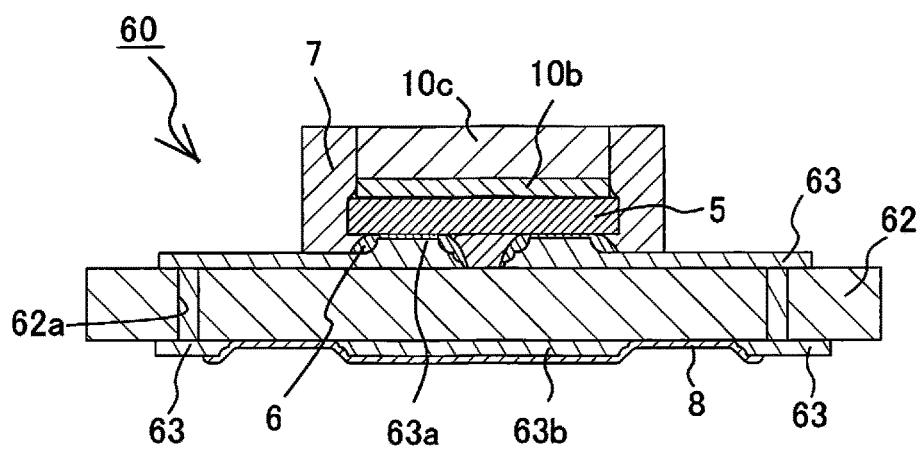
FIG. 11 is a schematic cross-sectional view illustrating a light emitting device according to still another embodiment of the present invention.

As illustrated in FIG. 11, the light emitting device 60 of the present embodiment includes through holes 62a in proximity to both ends in the longitudinal direction of the base material 62, and a pair of connection terminal 63 extends from the upper surface through the through hole 62a to the lower surface of the substrate. The light emitting device 60 has similar configuration to the light emitting device according to the first and the fourth embodiments with the exception that the end surface is not covered, and therefore the same effect as the first and the fourth embodiments can be imparted.

Eighth Embodiment

Figure 12A:
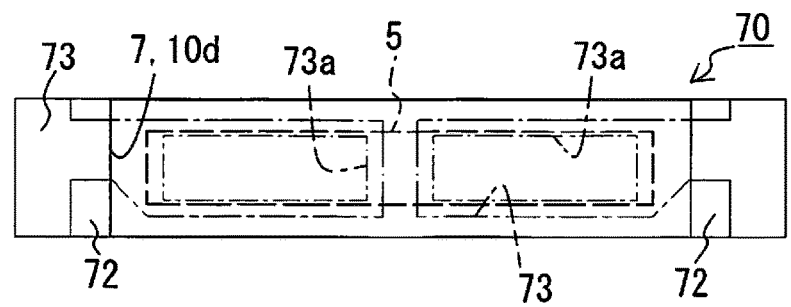
FIG. 12A is a partial schematic perspective plan view illustrating a light emitting device according to still another embodiment of the present invention.
Figure 12B:
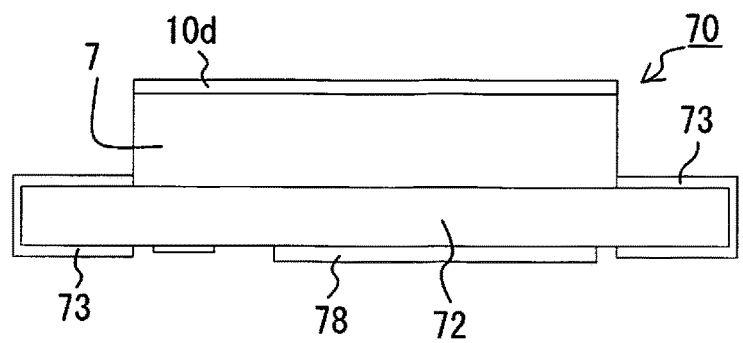
FIG. 12B is a side view of FIG. 12A.
Figure 12C:
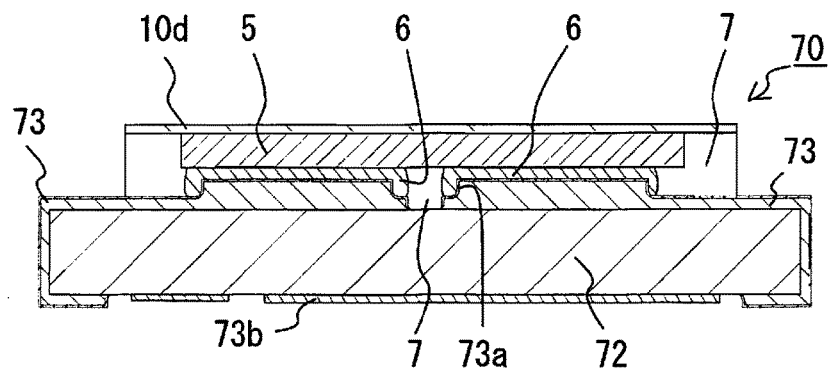
FIG. 12C is a cross-sectional view of FIG. 12A.
Figure 12D:
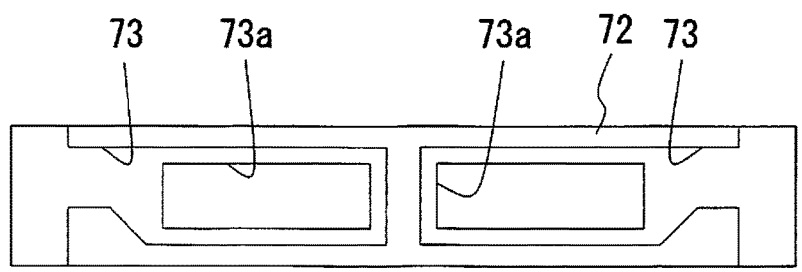
FIG. 12D is a plan view if the substrate in the light emitting of FIG. 12A.
Figure 12E:
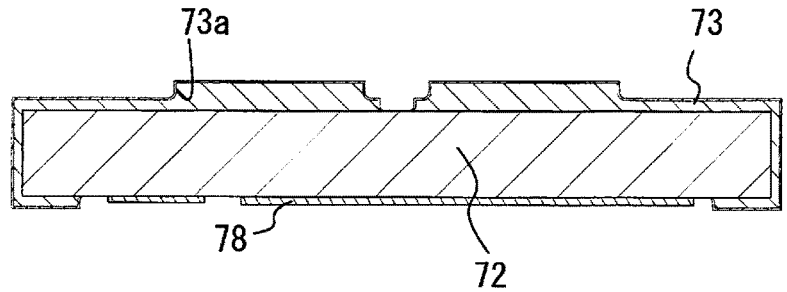
FIG. 12E is a cross-sectional view if the substrate in the light emitting of FIG. 12A.
Figure 12F:
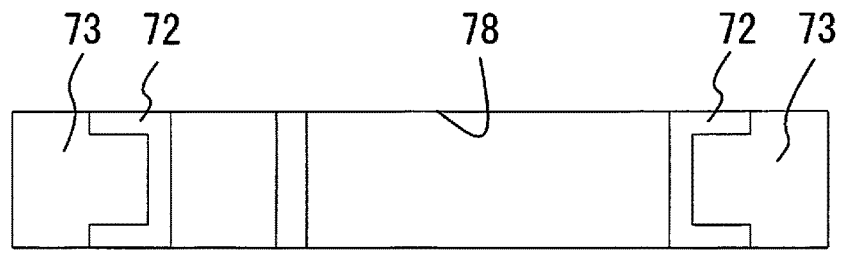
FIG. 12F is a back side view if the substrate in the light emitting of FIG. 12A.

As illustrated in FIG. 12A to FIG. 12G, the light emitting device 70 of the present embodiment includes a substrate including a base material 72, a pair of connection terminal 73 formed on the surface of the base material 72, one light emitting element 5, and a light reflecting member 7. The light emitting element 5 is connected by the molten material 6 to the two protruding portions 73a provided on the pair of connection terminal 73. Furthermore, as illustrated in FIG. 12E, an insulating film 78 is provided between the pair of connection terminals 78 on the rear surface of the substrate. Furthermore, a light transmissive member 10d is provided that includes a fluorescent material and which covers the upper surface of the sealing member 7 and the upper surface of the light emitting element 5.

The light emitting device 70 has similar configuration to the light emitting device according to the first embodiment with the exception that there is a difference the shape of the pattern of the pair of connection terminal 73 disposed on the base material 72 and the size of the protruding portions 73a formed on the surface of the connection terminals 73, and that the four end surfaces of the light transmissive member 10d coincide with the four end surfaces of the light reflecting member 7, and therefore the same effect as the first embodiment can be imparted.

The light emitting element 5 is an LED chip that capable to emit blue light (central emission wavelength of 455 nm) in a rectangular parallelepiped configuration with a length in a longitudinal direction of 0.8 mm, a width in the short direction of 0.3 mm and a thickness of 0.1 mm.

The substrate 4 is formed approximately in a rectangular parallelepiped configuration with a length in a longitudinal direction of 2.2 mm, a width in the short dimension direction of 0.4 mm and a thickness of 0.3 mm. The light reflecting member 7 is formed approximately in a rectangular parallelepiped configuration with a length in a longitudinal direction of 1.2 mm, a width in the short direction of 0.4 mm and a thickness of 0.3 mm.

Figure 12G:
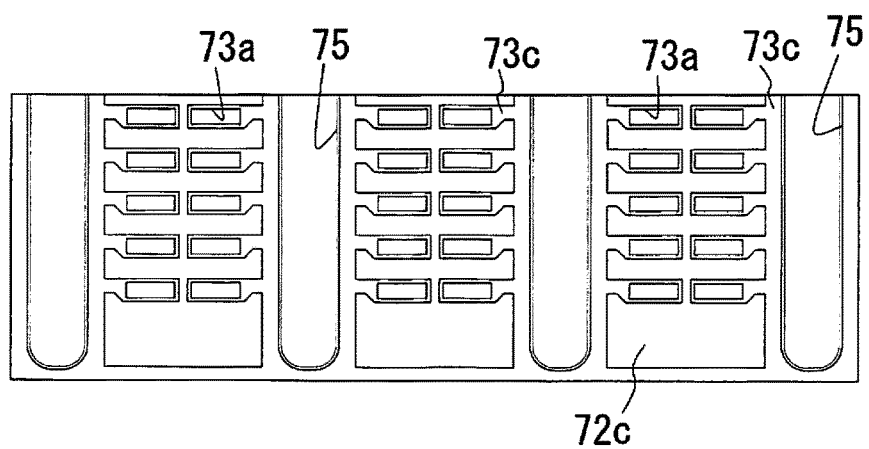
FIG. 12G is a schematic plan view of the substrate illustrating a method of the light emitting device of FIG. 12A.

As illustrated in FIG. 12G, the light emitting device 70 can be manufactured by similar manner to the first embodiment by use of an aggregate substrate having an aggregate connection terminal 73c on the base material 72c. The aggregate substrate is configured from a plurality of connected the substrates of each light emitting device as illustrated in FIG. 12D and FIG. 12E after the singulating step.

Ninth Embodiment

As illustrated in FIG. 13A to FIG. 13G, the light emitting device 80 of the present embodiment includes a substrate including a base material 82, connection terminals 83 and a second connection terminal 83c formed on the surface of the base material 82, two light emitting elements 5, and a light reflecting member 7.

The light emitting device 80 has similar configuration to the light emitting device according to the first embodiment with the exception that there is a difference in the number of light emitting elements 5, the shape of the pattern of the connection terminals 83 disposed on the base material 82, the size of the protruding portions 83a formed on the surface of the connection terminals 83, and that the four end surfaces of the light transmissive member 10d coincide with the four end surfaces of the light reflecting member 7, and therefore the same effect as the first embodiment can be imparted.

The two light emitting elements 5 are in a rectangular parallelepiped configuration with a length in a longitudinal direction of 1.1 mm, a width in the short direction of 0.2 mm and a thickness of 0.2 mm, and mounted at intervals of 0.4 mm in a longitudinal direction of the substrate.

The substrate 4 is formed approximately in a rectangular parallelepiped configuration with a length in a longitudinal direction of 3.5 mm, a width in the short dimension direction of 0.4 mm and a thickness of 0.15 mm. The light reflecting member 7 is formed approximately in a rectangular parallelepiped configuration with a length in a longitudinal direction of 3.0 mm, a width in the short direction of 0.4 mm and a thickness of 0.2 mm at a center on the first main surface of the substrate.

The base material 82 includes through holes 82d between the two light emitting elements 5 and embeds the through holes 82d so that the second connection terminal 83e extends to the rear surface of the substrate. In this configuration, the second connection terminal 83e is provided between two light emitting elements 5 on the rear surface of the substrate. More specifically, it is located between the two insulating films 84b provided respectively directly below the two light emitting elements on the rear surface of the substrate. The two insulating films 84b are placed in contact with the base material 82, and are provided separately from the respective connection terminal 83 and second connection terminal 83e. The second connection terminal 83e is exposed and not covered by the insulating film on the rear surface of the substrate, and when the light emitting device is mounted, it functions as a thermal radiation terminal by connection with a bonding material such as solder, or the like.

A light transmissive member 10d that contains a fluorescent material is provided to cover the upper surface of the sealing member 7 and the upper surface of the two light emitting elements 5.

Figure 13A:
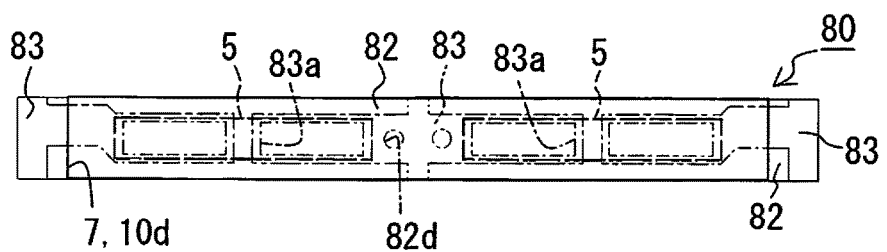
FIG. 13A is a partial schematic perspective plan view illustrating a light emitting device according to still another embodiment of the present invention.
Figure 13B:
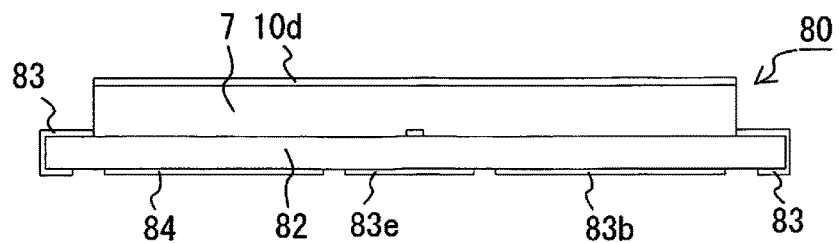
FIG. 13B is a side view of FIG. 13A.
Figure 13C:
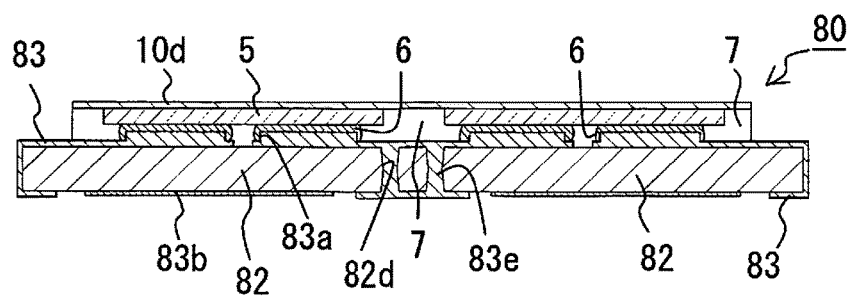
FIG. 13C is a cross-sectional view of FIG. 13A.
Figure 13D:
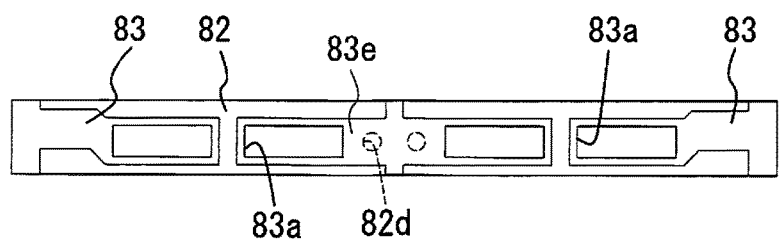
FIG. 13D is a plan view if the substrate in the light emitting of FIG. 13A.
Figure 13E:
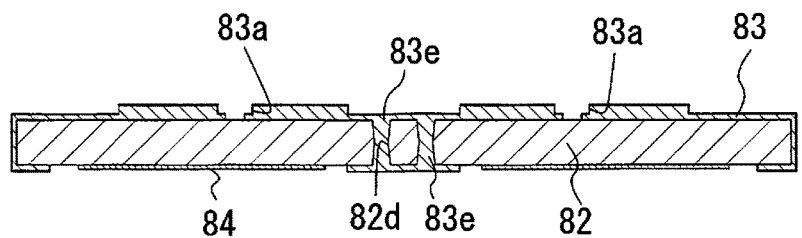
FIG. 13E is a cross-sectional view if the substrate in the light emitting of FIG. 13A.
Figure 13F:
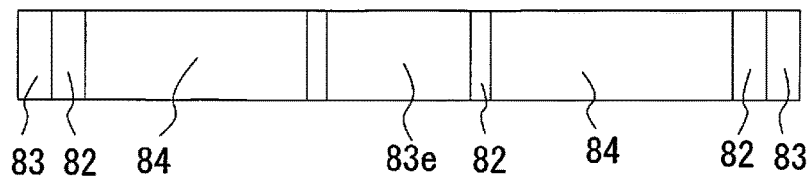
FIG. 13F is a back side view if the substrate in the light emitting of FIG. 13A.
Figure 13G:
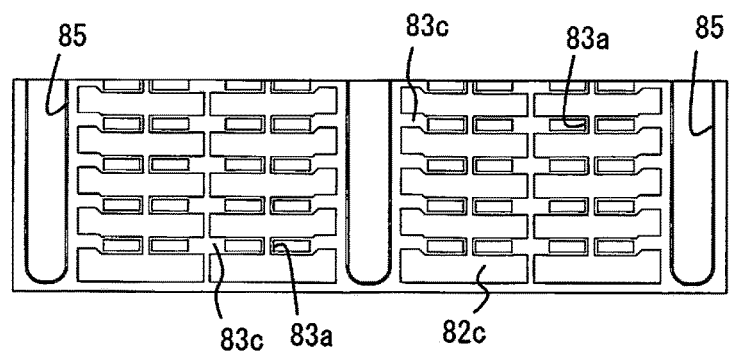
FIG. 13G is a schematic plan view of the substrate illustrating a method of the light emitting device of FIG. 13A.

As illustrated in FIG. 13G, the light emitting device 80 can be manufactured by similar manner to the first embodiment by use of an aggregate substrate having an aggregate connection terminal 83c on the base material 82c. The aggregate substrate is configured from a plurality of connected substrates of each light emitting device as illustrated in FIG. 13D and FIG. 13E after the singulating step.

Tenth Embodiment

Figure 14:
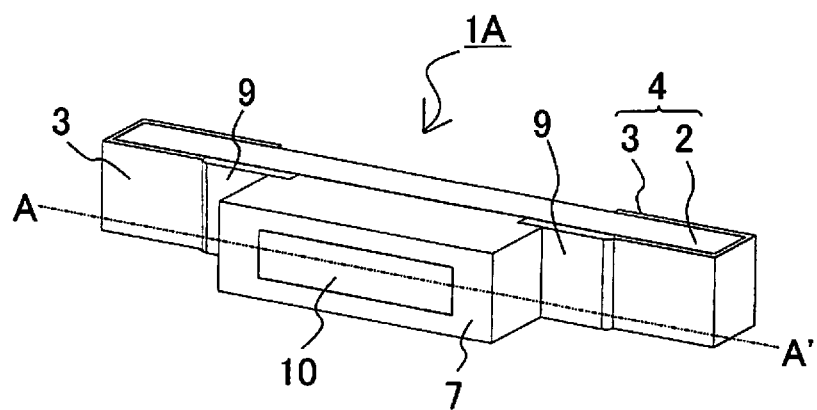
FIG. 14 is a schematic perspective view illustrating a light emitting device according to an embodiment of the present invention.
Figure 16:
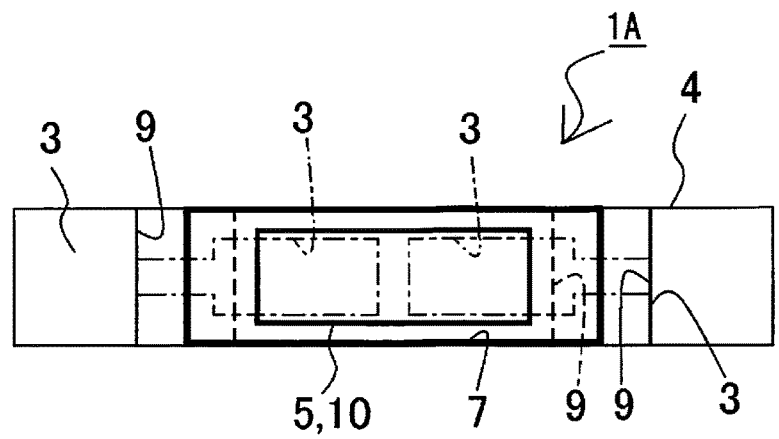
FIG. 16 is a perspective plan view of the light emitting device of FIG. 14.

As illustrated in FIG. 14 to FIG. 16, the light emitting device 1A of the present embodiment has a substrate 4 that has a pair of connection terminal 3, a light emitting element 5, and a light reflective member 7.

The substrate 4 has a pair of connection terminals 3 formed by laminating Cu/Ni/Au from the base material 2 side onto the surface (the upper surface 2a that is the first main surface, and end surface 2b that extends in the direction of the short dimension, and the lower surface 2c that is the second main surface) of the rectangular parallelepiped base material 2 that is formed by a glass epoxy resin. The substrate 4 is served as a wiring base and has a length in a longitudinal direction of 2.2 mm, a width in the short dimension direction of 0.4 mm and a thickness of 0.3 mm.

The pair of connection terminals 3 includes an element connection portion 3c in a mutually adjacent configuration on a central portion of the upper surface 2a side of the base material 2. The pair of connection terminals 3 extends respectively from the element connection portion 3c in the longitudinal direction, from the upper surface 2a of the base material 2 through respective end surface 2b to the lower surface 2c of the substrate. The outer connection portions 3b of the connection terminals 3 are positioned where extend from the element connection portion 3c and to the lower surface 2c of the base material 2 (position in the shape of a letter U when viewed in cross section) (reference is made to FIG. 15). The edge portion along the longitudinal direction of each connection terminal 3 coincides with the edge portion along the longitudinal direction of the substrate 4, and the end surface along the longitudinal direction of each connection terminal 3 is formed coplanar with the end surface along the longitudinal direction of the substrate 4.

Each connection terminals 3 includes a small width portion between the element connection portion 3c and the outer connection portions 3b, respectively (reference is made to FIG. 16). A portion of the outer connection portions 3b on the second main surface of the substrate 4 includes a small width portion.

The light emitting element is mounted on the connection portion 3c of the substrate 4 by flip-chip manner.

The light emitting element 5 is formed of a laminated body (a semiconductor laminate) of a nitride semiconductor on a sapphire substrate, and includes a pair of positive/negative electrodes on the surface that is opposite to the sapphire substrate of the laminated body. The pair of positive/negative electrodes of the light emitting element 5 is bonded by bonding agents 6 that is Au—Sn eutectic solder to the connection portion 3c of the pair of connection terminals 3 on the substrate 4. The light emitting element 5 is an LED chip that capable to emit blue light (central emission wavelength of 455 nm) in a rectangular parallelepiped configuration with a length in a longitudinal direction of 0.8 mm, a width in the short direction of 0.3 mm and a thickness of 0.1 mm.

The sealing member 7 is formed approximately in a rectangular parallelepiped configuration with a length in a longitudinal direction of 1.2 mm, a width in the short direction of 0.4 mm and a thickness of 0.3 mm. That is to say, the edge portion along the longitudinal direction of the sealing member 7 respectively coincides with the edge portion along the longitudinal direction of the substrate 4. The sealing member 7 is provided on the first main surface of the substrate 4 in contact with the light emitting element 5 and to cover the entire periphery of the end surface of the light emitting element 5. Furthermore, the sealing member 7 is also provided on the surface facing the substrate 4 of the light emitting element 5, and between the molten materials 6.

In this manner, light from the light emitting element 5 to the upper surface of the light emitting device can be efficiently extracted.

The sealing member 7 is formed by a silicon resin in which silica having an average particle diameter of 14 microns and titanium oxide having an average particle diameter of 0.25 microns to 0.3 microns are respectively composed as 2 to 2.5 wt % and 40 to 50 wt % relative to the total weight of the sealing member 7.

A portion of the small width portion of each connection terminal 3 and the outer connection portions are exposed from the sealing member 7 on both sides of the sealing member 7 on the substrate 4.

The edge portion along the longitudinal direction of the sealing member 7 coincides with the edge portion along the longitudinal direction of the substrate 4, and the end surface along the longitudinal direction of the sealing member 7 is formed coplanar with the end surface along the longitudinal direction of the substrate 4.

Insulating members 9 are disposed on the connection terminal 3 and between the element connection portion 3c and the outer connection portion. Each of the insulating members 9 are formed approximately in a rectangular parallelepiped configuration with a length in a longitudinal direction of 0.5 mm, a width in the short direction of 0.4 mm and a thickness of 0.02 mm. The insulating member 9s are exposed by 0.3 mm in a longitudinal direction from the end surfaces of the sealing member 7. The insulating members 9 cover the small width portion and the periphery of the pair of the connection terminal 3 respectively.

The edge portion facing the longitudinal direction of the sealing member 7 is disposed on the insulating members 9, and the edge portion along the longitudinal direction of the sealing member 7 coincides with the edge portion along the longitudinal direction of the insulating members 9. Furthermore, the edge portion along the longitudinal direction of the insulating members 9 coincides with the edge portion along the longitudinal direction of the substrate, and the end surface along the longitudinal direction of the insulating member 9 is formed to be coplanar with the end surface along the longitudinal direction of the substrate.

The insulating member 9s are formed from white silicon resin containing titanium dioxide.

A light transmissive member 10 configured as a sheet of silicon resin (thickness 0.1 mm) that includes a YAG:Ce fluorescent material is disposed on the light emitting element 5, that is to say, on the opposite surface of the surface in which the pair of positive and negative electrodes formed.

The end surfaces of the light transmissive member 10 are covered by the sealing member 7. The upper surface of the light transmissive member 10 and the upper surface of the sealing member 7 are formed in a coplanar configuration.

Figure 17:
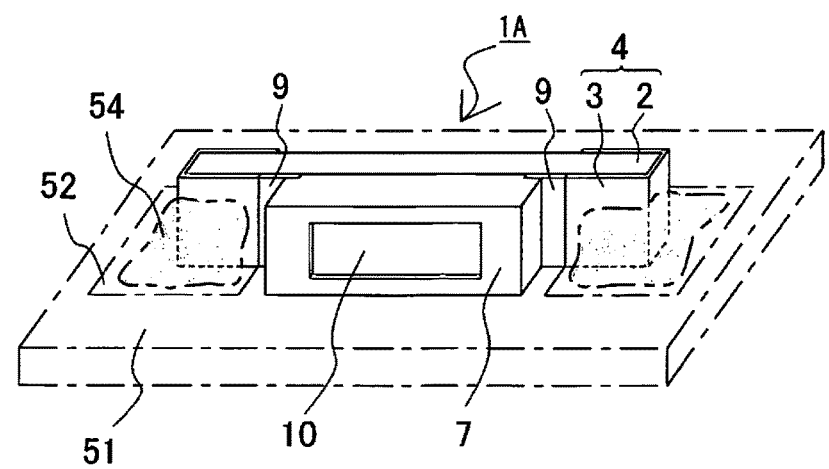
FIG. 17 is a schematic perspective view illustrating the light emitting device of FIG. 14 which is mounted on a mounting board.

As illustrated in FIG. 17, the pair of end surfaces along the longitudinal direction of the substrate 4 and the pair of end surfaces along the longitudinal direction of the light reflecting member 7 of the light emitting device 1A are disposed respectively in a coplanar configuration. The light emitting device 1A is mounted in a side-view manner on the mounting board 51 that has a surface wiring pattern 52. One of the end surfaces in the coplanar configuration is served as a mounting surface of the light emitting device 1A. The mounting is configured so that the pair of outer connection portions 3b of the light emitting device 1A is respectively disposed on the wiring pattern 52 corresponding to the positive and negative electrodes of the mounting board 51, and is connected by solders 54. The solder 54 is connected with the small connection terminal 3 at the end surface and the second main surface in addition to the first main surface of the substrate 4 on the outer connection portion 3b that is curved in the shape of the letter U. In this manner, a solder fillet can be formed on the side surfaces of the light emitting device 1A and thereby enhances the mounting stability and thermal radiation performance of the light emitting device 1A.

The disposition of a small width portion between the element connection portion 3c and the outer connection portion 3b in the connection terminals 3 can suppress penetration under the sealing member 7 of solder or the like and flux or the like contained therein that are connected with the outer connection portion 3b.

Both one of the end surface along the longitudinal direction of the substrate 4 and one of the end surface along the longitudinal direction of the sealing member 7 are in contact with the surface of the mounting board 51.

The sealing member 7 itself is provided with an extremely thin wall configuration on the periphery of the light emitting element 5, and therefore it is possible to sufficiently downsize the light emitting device 1A. Furthermore, the formation of the sealing member 7 with the light reflecting or light blocking material enables extraction of light, which emits to lateral direction of the light emitting element to reflect to upward of the light emitting device by the light reflecting member 7. Therefore, the use efficiency of the light can be enhanced.

Figure 18A:
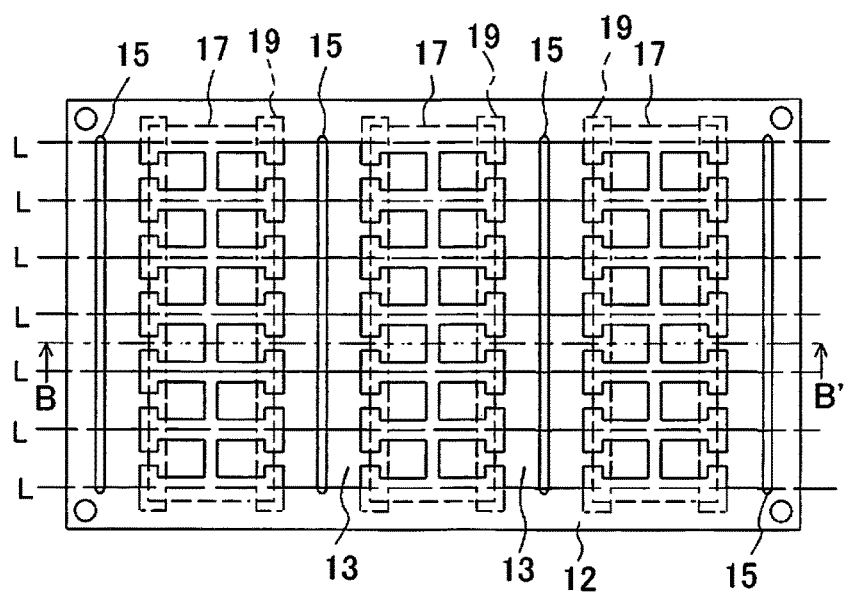
FIG. 18A is a schematic plan view illustrating a method of the light emitting device of FIG. 14.
Figure 18B:
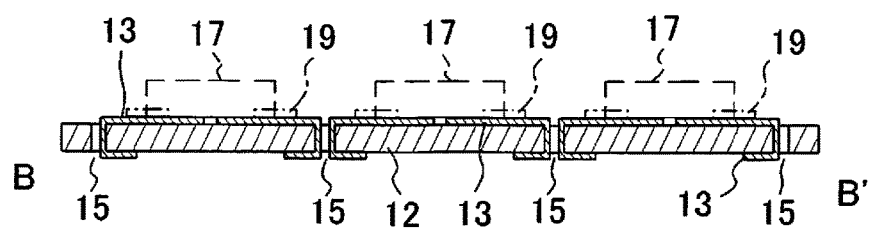
FIG. 18B is a cross-sectional view taken along line B-B' of FIG. 18A.

As illustrated in FIG. 18A and FIG. 18B, the light emitting device 1A can manufactured by use of an aggregate substrate 14 that has an aggregate connection terminal 13 on the base material 12. The aggregate substrate 14 is configured by connection of a plurality of units that form the substrate of each light emitting device 1A after the singulating process.

The aggregate substrate 14 includes slits 15 from the upper surface to the rear surface of the base material 12. The aggregate connection terminal 13 is provided in connection from the upper surface to the lower surface of the base material 12 of the aggregate substrate 14 through the inner wall of the slits 15.

Although FIG. 18A shows the aggregate substrate 14 which forms eighteen light emitting devices, the aggregate substrate 14 can be configured to form more numerous (several hundred to several thousand) light emitting device 1A when manufacture efficiency is considered.

The insulating members 19 are integrally-formed on the aggregate substrate 14 which includes a plurality of the substrate. Then, a plurality of light emitting element 5 are connected on the aggregate substrate 14 and the light transmissive members 10, that have substantially the same shape as the light emitting element 5 in a plan view, are adhered onto each of the light emitting element 5. A plurality of sealing members 17 is formed in a single operation by use of compressive molding to cover the end surface of the light transmissive member and the light emitting element. Then the aggregate substrate 14 and the sealing members 17 are cut in a single direction along the predetermined dividing lines L which intersect with the slits 15 at substantially right angles. In this manner, division along the direction of extension of the slits is enabled to obtain light emitting devices separated into units in comparatively few processing steps.

A dicer, a laser, or the like can be used in the cutting process.

Eleventh Embodiment

Figure 19A:
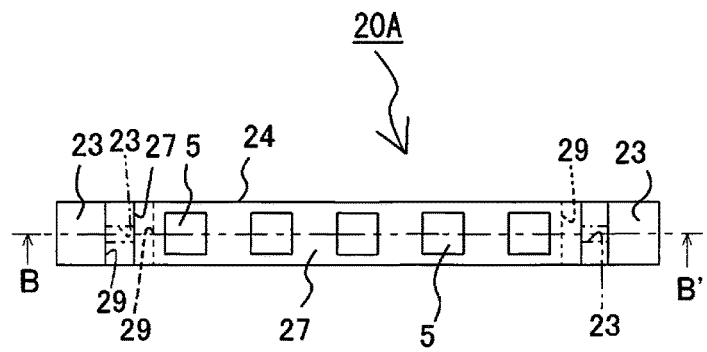
FIG. 19A is a plan view illustrating a light emitting device according to another embodiment of the present invention.
Figure 19B:
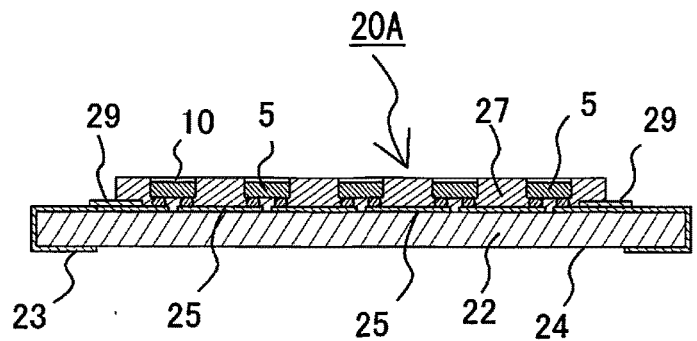
FIG. 19B is a cross-sectional view taken along line C-C' of the light emitting device of FIG. 19A.

As illustrated in FIGS. 19A and 19B, the light emitting device 20A according to this embodiment includes a substrate 24 that has connection terminals 23, a plurality of light emitting elements 5, and a sealing member 27.

Each of the connection terminal 23 are disposed on the base material 22 so as to extend to the upper surface, the end surface and the lower surface on both sides in the longitudinal direction of the base material 22. Furthermore, further terminals 25 which can connect a plurality of light emitting elements 5 for example in series and is disposed on the upper surface of the base material 22.

A plurality of light emitting elements 5 is disposed by alignment into a line. The arrangement of the light emitting elements is also possible into a matrix configuration in addition to a linear configuration.

The sealing member 27 integrally seals the plurality of light emitting element 5. The end surfaces along the longitudinal direction of the sealing member 27 are formed coplanar with the end surfaces along the longitudinal direction of the substrate 24. The edge portion facing the short direction of the sealing member 27 is disposed on the inner side of the substrate 24.

The insulating members 29 are disposed such that each edge portion in a short direction of the sealing member 27 is positioned on the insulating member 29 respectively.

It is preferred that a recessed portion or through hole is formed in the substrate 24 between the light emitting elements 5, and a portion of the sealing member 27 is filled into the recessed portion or the through hole to thereby seal the sealing member 27 to the substrate 24. In this manner, the adhesion between the sealing member 27 and the substrate 24 can be enhanced, and it is possible to prevent peeling of the sealing member 27 from the substrate 24.

Features other than those described above are similar to the tenth embodiment, and therefore the same effect as the tenth embodiment can be imparted. Furthermore, the light emitting device of the present embodiment can be used as a linear or matrix type side-view light emitting device. Therefore, the light emitting device enhances mounting accuracy in comparison to mounting individual side-view light emitting devices on a mounting board respectively. Furthermore, alignment characteristics with the light guide plate are enhanced in case where functioning for example as a backlight light source.

Twelfth Embodiment

Figure 20:
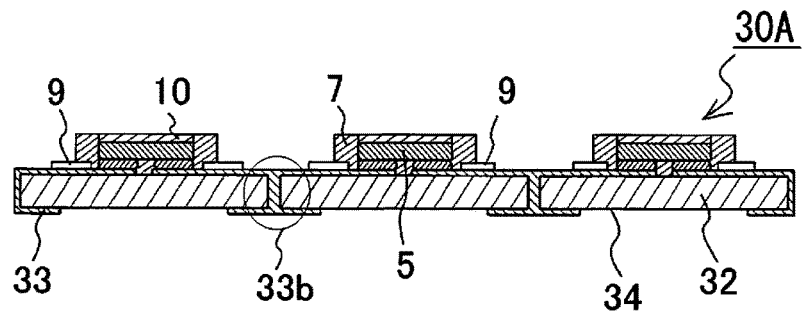
FIG. 20 is a plan view illustrating a light emitting device according to another embodiment of the present invention.

As illustrated in FIG. 20, the light emitting device 30A according to the present embodiment arranges a plurality of light emitting device according to the tenth embodiment are connected each other into the direction of a row or a matrix in a configuration that the light emitting devices sharing the adjacent connection terminals 33, and in particular the outer connection portion 33b. Through holes are provided in the base material 32 between adjacent light emitting elements 5, and the connection terminals 33 are drawn towards the lower surface side of the substrate 34 through the through holes.

Features other than those described above are similar to the tenth embodiment. Therefore, the same effect as the first embodiment can be imparted, and the same effect as the second embodiment can be also imparted.

The light emitting device according to the present invention can be used for back light sources for liquid crystal displays; various kinds of lighting apparatus; large-size displays; various kinds of displays for advertising, direction information guide and the like; image scanners such as digital video camera, facsimile, coping machine, scanner; projector apparatus and the like.

As illustrated above, embodiments are described to give a concrete form to technical ideas of a light emitting device according to the present invention, the present invention is not limited to the described embodiments of the present invention. Also, obviously, numerous modifications and variations of the present invention are possible in light of the above teachings, which are within the scope and spirit of the invention, and such other modifications and variations are intended to be covered by the following claims.

What is claimed is:

1. A light emitting device of side-view type comprising:
   a substrate including a pair of connection terminals at least on a first main surface of the substrate,
   a light emitting element disposed on a first main surface side of the substrate and connected to the connection terminals,
   an insulating member disposed to cover at least a portion of the connection terminals, and
   a light reflecting or sealing member covering the light emitting element,
   the connection terminals each including an element connection portion and an outer connection portion disposed on the first main surface of the substrate, the element connection portion being connected with the light emitting element and the outer connection portion being configured to connect with an external unit of the light emitting device, at least a part of an end surface of the outer connection portion and an end surface of the substrate being on the same plane, and
   the insulating member being placed in contact with the light reflecting or sealing member, and disposed between the element connection portion and the outer connection portion.

2. The light emitting device according to claim 1, wherein an additional light emitting element is disposed on the substrate, and
   the light emitting element and the additional light emitting element are aligned along a longitudinal direction of the substrate, which coincides a longitudinal direction of the light emitting element and the additional light emitting element.

3. The light emitting device according to claim 1, further comprising
   a light transmissive member disposed on a first main surface of the light emitting element.

4. The light emitting device according to claim 1, wherein the outer connection portions are disposed on the first main surface, side surfaces and a second main surface of the substrate.

5. The light emitting device according to claim 1, wherein the light emitting element is connected to the connection terminals by a molten material,
   at least one of the connection terminals includes a protruding portion projecting from a first main surface of the connection terminal at a region which is connected with the light emitting element,
   the protruding portion and the molten material are embedded into the light reflecting or sealing member, with the molten material being disposed on an upper surface and a side surface of the protruding portion.

6. The light emitting device according to claim 1, wherein side surfaces of the light emitting element are covered with the light reflecting or sealing member, and a first main surface of the light emitting element which is at the same side of the first main surface of the substrate is exposed from the light reflecting or sealing member.

7. The light emitting device according to claim 1, wherein the end surface of the substrate is configured as a mounting surface, and the light reflecting or sealing member is arranged to be coplanar with the end surface of the substrate.

8. The light emitting device according to claim 1, wherein the light reflecting or sealing member fills a space defined between the substrate and the light emitting element.

9. The light emitting device according to claim 1, wherein a first main surface of the light emitting element forms a coplanar surface with a first main surface of the light reflecting or sealing member, or is higher than the first main surface of the light reflecting or sealing member.

10. The light emitting device according to claim 3, wherein
the light transmissive member contains a fluorescent material that is configured to be excited by light emitted from the light emitting element.

11. The light emitting device according to claim 3, wherein
an end surface of the light transmissive member and a side surface of the light emitting element are covered with the light reflecting or sealing member .

12. The light emitting device according to claim 3, wherein
an end surface of the light transmissive member is arranged to be coplanar with an end surface of the light reflecting or sealing member.

13. The light emitting device according to claim 10, wherein
the fluorescent material includes KSF fluorescent material or quantum dot fluorescent material.

14. The light emitting device according to claim 1, wherein
the light emitting element includes a pair of electrodes arranged on a same surface side of the light emitting element, and
the light emitting element is mounted on the substrate by flip chip mounting so that the electrodes of the light emitting element are respectively connected to the connection terminals.

15. A light emitting device of side-view type comprising:
a substrate including a pair of connection terminals at least on a first main surface of the substrate;
a light emitting element disposed on a first main surface side of the substrate and connected to the connection terminals;
an insulating member disposed to cover at least a portion of the connection terminals; and
a light reflecting or sealing member covering the light emitting element, wherein
the connection terminals each includes an element connection portion and an outer connection portion disposed on the first main surface of the substrate, the element connection portion is connected with the light emitting element and the outer connection portion is configured to connect with an external unit of the light emitting device,
the insulating member is placed in contact with the light reflecting or sealing member, and disposed between the element connection portion and the outer connection portion, and
an end surface of the substrate and an end surface of the connection terminals are coplanar with an end surface of the light reflecting or sealing member.

16. The light emitting device according to claim 5, wherein
the molten material includes a solder.

17. The light emitting device according to claim 1, wherein
a part of the outer connection portion disposed on the first main surface of the substrate is exposed.

18. The light emitting device according to claim 4, wherein
a part of the outer connection portion disposed on the side surfaces of the substrate is exposed.

19. The light emitting device according to claim 1, wherein
the insulating member is placed between the element connection portion and a part of the outer connection portion that is exposed.

* * * * *